(12) United States Patent
Moilanen

(10) Patent No.: US 10,964,678 B2
(45) Date of Patent: Mar. 30, 2021

(54) LED SCREEN OR ILLUMINATION MEANS WITH A FLEXIBLE FILM STRUCTURE

(71) Applicant: LedFoil Finland Oy, Oulu (FI)

(72) Inventor: Pekka Moilanen, Oulu (FI)

(73) Assignee: LedFoil Finland Oy, Oulu (FI)

( * ) Notice: Subject to any disclaimer, the term of this patent is extended or adjusted under 35 U.S.C. 154(b) by 26 days.

(21) Appl. No.: 16/310,829

(22) PCT Filed: Jun. 21, 2016

(86) PCT No.: PCT/FI2016/050450
§ 371 (c)(1),
(2) Date: Dec. 18, 2018

(87) PCT Pub. No.: WO2017/220847
PCT Pub. Date: Dec. 28, 2017

(65) Prior Publication Data
US 2020/0066696 A1 Feb. 27, 2020

(51) Int. Cl.
*H01L 25/16* (2006.01)
*H02S 40/38* (2014.01)
(Continued)

(52) U.S. Cl.
CPC ............ *H01L 25/167* (2013.01); *F21S 9/035* (2013.01); *H01L 23/5386* (2013.01); *H01L 23/5387* (2013.01); *H01L 25/0753* (2013.01); *H01L 25/0756* (2013.01); *H01L 25/165* (2013.01); *H01L 33/56* (2013.01); *H01L 33/62* (2013.01); *H02S 40/38* (2014.12); *H04W 76/10* (2018.02);
(Continued)

(58) Field of Classification Search
None
See application file for complete search history.

(56) References Cited

U.S. PATENT DOCUMENTS 9,897,292 B1 * 2/2018 Lindblad ................. H01L 24/00
2009/0237011 A1 9/2009 Shah et al.
(Continued)

FOREIGN PATENT DOCUMENTS

CN 101582225 A 11/2009
EP 2690343 A1 1/2014
(Continued)

*Primary Examiner* — Ali Naraghi
(74) *Attorney, Agent, or Firm* — Berggren LLP

(57) ABSTRACT

The present invention is a flexible thin film based screen or illumination apparatus with a stacked layer structure or a one-layer structure. Transparent polymer is preferably used in different layers, and energy can be collected directly by a solar panel layer of the screen structure. Different resolutions are available through using a various number of layers with LEDs. Frames and connecting means can be used and a special connection principle enables selected layers of a single module, and/or selected layers of adjacent modules to be electrically coupled. The present invention can be used in (Continued)

any planar or non-planar shape, and as a single-sided or dual-sided LED screen or illumination device, e.g. as information screens, traffic information means, advertisement platform, in architectonic media surfaces, in sports venues, and for various entertainment purposes. Wireless and IoT connectivity means can be provided in the apparatus.

13 Claims, 11 Drawing Sheets

(51) Int. Cl.
| | |
|---|---|
| *H04W 76/10* | (2018.01) |
| *F21S 9/03* | (2006.01) |
| *H01L 23/538* | (2006.01) |
| *H01L 25/075* | (2006.01) |
| *H01L 33/56* | (2010.01) |
| *H01L 33/62* | (2010.01) |
| *F21Y 105/16* | (2016.01) |
| *F21Y 115/10* | (2016.01) |
| *E06B 7/28* | (2006.01) |
| *G09F 9/30* | (2006.01) |
| *H04W 84/18* | (2009.01) |

(52) U.S. Cl.
CPC ............ *E06B 7/28* (2013.01); *F21Y 2105/16* (2016.08); *F21Y 2115/10* (2016.08); *G09F 9/301* (2013.01); *H01L 2933/005* (2013.01); *H01L 2933/0066* (2013.01); *H04W 84/18* (2013.01)

(56) References Cited

U.S. PATENT DOCUMENTS

| | | | |
|---|---|---|---|
| 2010/0265711 A1 | 10/2010 | Lee | |
| 2011/0163683 A1 | 7/2011 | Steele et al. | |
| 2013/0074538 A1 | 3/2013 | Forsberg et al. | |
| 2015/0267907 A1* | 9/2015 | Thompson | F21V 23/06 |
| | | | 362/249.06 |
| 2015/0357315 A1* | 12/2015 | Oraw | G09G 3/32 |
| | | | 315/294 |
| 2016/0154170 A1 | 6/2016 | Thompson et al. | |
| 2016/0163940 A1* | 6/2016 | Huang | H01L 25/0756 |
| | | | 257/89 |
| 2017/0254528 A1* | 9/2017 | Van Grunsven | B65D 83/60 |

FOREIGN PATENT DOCUMENTS

| | | |
|---|---|---|
| JP | H04110992 A | 4/1992 |
| JP | 2003059332 A | 2/2003 |
| WO | 2006/018066 A1 | 2/2006 |
| WO | 2011/046961 A1 | 4/2011 |
| WO | 2015/060098 A1 | 4/2015 |
| WO | 2015/092140 A1 | 6/2015 |
| WO | 2016/083663 A1 | 6/2016 |

* cited by examiner

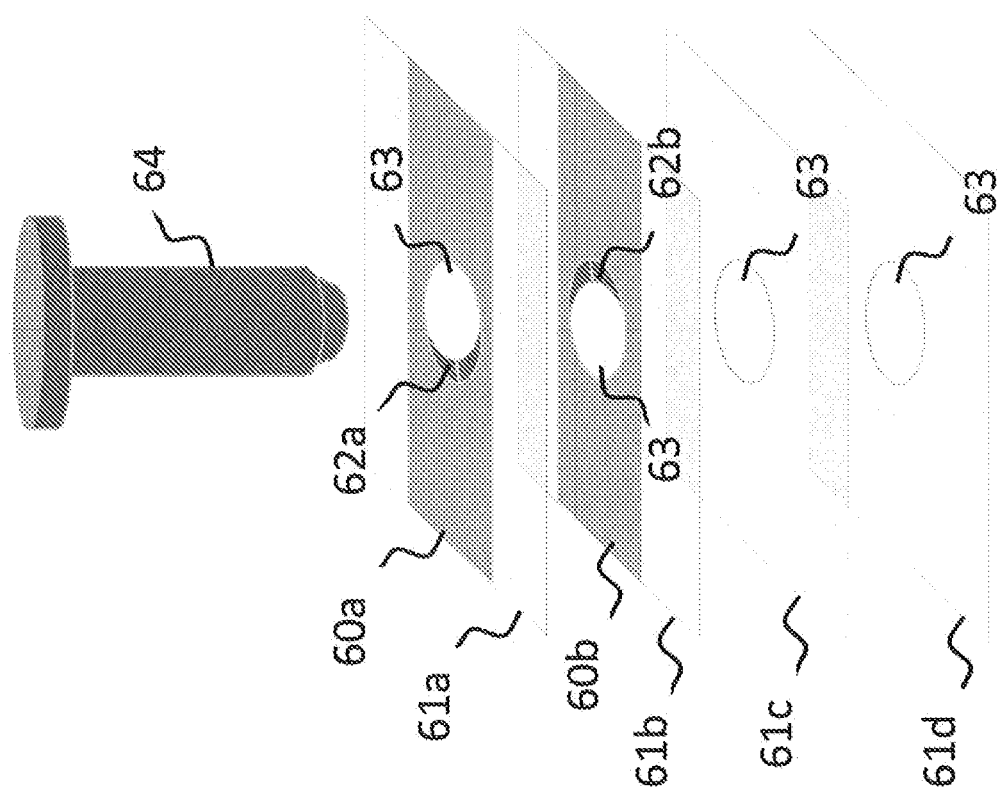
Figure 6b
Figure 6a
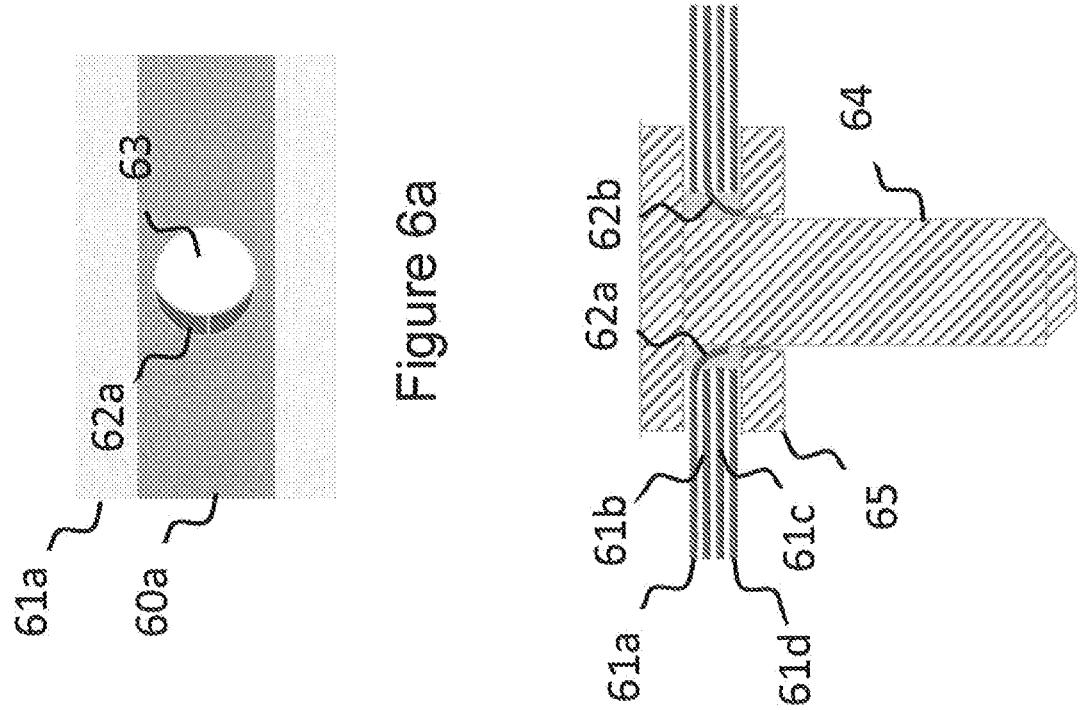
Figure 6c

LED SCREEN OR ILLUMINATION MEANS WITH A FLEXIBLE FILM STRUCTURE

This application is a U.S national application of the international application number PCT/FI2016/050450 filed on Jun. 21, 2016.

FIELD OF THE INVENTION

The present invention relates to LED display and illumination devices arranged in a flexible thin film arrangement.

BACKGROUND OF THE INVENTION

LED (Light Emitting Diode) based display technology has emerged lately in many various applications. Usually LEDs are used in flat panel displays where the light emitting diodes are formed in an array in order to create pixels for a video display. LED displays are currently used especially in outdoor signs and information boards, and also e.g. public transport vehicles as information signs. RGB LEDs can be used to create the colours in the video image.

Organic LEDs (OLEDs) have also been used in monitors and TV screens, for instance. OLED technology is based on emissive electroluminescent layer made of organic compound which is capable to emit light in response to an incoming electric current. The electrodes which are connected to the organic layer may be transparent.

Publication WO 2011/046961 (BML Productions Inc.) discloses a hermetically sealed OLED display which can be positioned below a surface of an ice layer. The display layer is placed directly below the ice, and the display layer is on top of a chilled concrete layer which in turn can be piped in order to cool this layer. The chilled layer is separated from warmer base layers by an insulating layer. Several pieces of displays can be configured together in a grid-like arrangement, i.e. in a matrix-form.

Publication WO 2015/092140 (Flexbright Oy) discloses an illumination structure which is implemented by a flexible and rollable thin film. It comprises a polymeric layer whose other side comprises a pattern (electronic circuit) layer which is electrically conductive and flexible. The structure comprises a hole for the LED flip-chip, which in turn is connected to the pattern layer through contact areas. On top of the LEDs and the polymeric layer, there is a flexible shielding layer. The thickness of the polymeric layer is mentioned to be less than 100 micrometers. The light source film is manufactured with a roll-to-roll method.

Publication US 2013/0074538 (Forsberg) discloses a panel LED display which can be located under the ice surface of an ice rink. The LEDs are placed in enclosures of the panel, and there is a cooling apparatus which circulates the coolant through the enclosures in order to remove the heat generated by the LEDs. The panel of Forsberg is a stiff and rigid panel, and an acrylic sheet made of polymethyl methacrylate (PMMA) polymer is a preferable material for such a panel.

The prior art has a problem that current screen solutions have been mostly rigid planar panels which can only be attached on walls or placed on a support on a surface. This has led to the situation where locations and application areas of these devices are restricted. The flexibility of the current solutions is not always that good or not even possible at all. Also scalability regarding the given resolution of the LEDs and the transparency are issues which have not been so well handled in the past. Furthermore, current manufacturing methods have not been very cost-effective. Heat conduction has been a problem in some solutions.

SUMMARY OF THE INVENTION

The present invention introduces a layered and flexible thin film based LED screen or illumination module structure. The emphasis is in the structural elements in the modules forming the apparatus, and in the manufacturing method of such an apparatus, and not in the fully operational LED screen with all the required controlling means.

The inventive idea comprises various embodiments of a screen or illumination module structure, and also the connection principles between modules, and a corresponding manufacturing method of such screen or illumination module structures and thus, the final screen or illumination apparatus as well. Furthermore, a computer program or several computer programs may be used in implementing the manufacturing method into practice.

Furthermore, the inventive idea comprises various uses of the screen structures and illumination modules in context with different installing platforms and application areas.

As a summary, the present invention discloses a screen or illumination apparatus, which comprises:
- at least one module where each module comprises a layer arrangement of at least one layer, where at least one layer is at least partly made of a polymer,
- the layer arrangement comprises a LED layer arrangement of at least one LED layer which comprises a plurality of LEDs, where each single LED layer comprises electrically conductive patterns, where the LEDs are electrically coupled with the electrically conductive patterns, and in case at least one module comprises at least two layers:
- the layers are stacked on top of each other for each module in order to form the layer arrangement for the at least one module, and in case at least two modules are formed,
- connecting the at least two modules together in order to form the apparatus.

In one embodiment of the invention, the layer arrangement as such is at least partly flexible.

In one embodiment of the invention, the layer arrangement as such is at least partly transparent.

In one embodiment of the invention, in the apparatus, when the apparatus is set in a planar form, a first part of the LEDs are directed to a first viewing direction and a second part of the LEDs are directed to a second viewing direction opposite to the first direction, resulting in a dual-sided display or illumination device.

In one embodiment of the invention, the apparatus further comprises a plurality of holes in at least one layer in order to enhance transparency for the apparatus, and/or for providing spaces for LEDs of an adjacent layer.

In one embodiment of the invention, the functionality of a single layer is selected from a group of: a LED layer, a solar panel layer, an electrically conductive pattern layer, a battery layer, a holed film layer, a physical support layer, a protective layer, a thermally conductive layer, a thermally insulating layer, a diffuser layer, a reflective layer, an electroluminescent emission layer, or a sensor layer comprising at least one dedicated sensor.

In one embodiment of the invention, the apparatus further comprises a plurality of modules placed adjacently side by side with a butt joint, or fixed together by the connecting means.

In one embodiment of the invention, the protective layer or means further comprises protective polymer strips of film placed adjacently to one another, or a layer of film, on at least a part of the surface area of the apparatus, or a single protective strip provided on top of the seam between two adjacent modules of the apparatus, or a sprayed material on at least a part of the surface area of the apparatus, or a polymer material which has been injection molded on at least a part of the surface area of the apparatus.

In one embodiment of the invention, the apparatus further comprises a frame structure where the at least one module is fixed to, and wherein the frame structure comprises electrically conductive wires which are connectable to the selected locations of the modules through connecting means.

In one embodiment of the invention, selected layers of a single module, and/or selected layers of adjacent modules are fixed and/or electrically coupled by connecting means, where the connecting means is made of an electrically conductive material.

In one embodiment of the invention, the electrically conductive pattern of the selected layer is electrically coupled to the connecting means by a connection securing means when the connecting means is in place, and where the connecting means is conductive, and where the connection securing means is an additional section of electrically conductive wire pressing onto the connecting means, and/or conductive adhesive placed around the connecting means.

In one embodiment of the invention, the apparatus comprises:
one or two LED layer arrangements,
one or two solar panel layers, and
at least one battery layer,
arranged in an order, where the solar panel layer or layers are able to collect light energy either directly as an outermost layer or through the at least partly transparent layers of the screen or illumination apparatus, resulting into a one- or dual-sided screen or illumination apparatus.

In one embodiment of the invention, the LED layer arrangement is combined with another LED layer arrangement, where the latter LED layer arrangement has been flipped 180 degrees before the combining, in order to achieve a dual-sided LED screen or illumination apparatus.

In one embodiment of the invention, the apparatus further comprises wireless connectivity means.

In one embodiment of the invention, the apparatus further comprises IoT connectivity means.

According to the second inventive aspect of the invention, a manufacturing method for a screen or illumination apparatus is disclosed. The manufacturing method comprises the steps of:
manufacturing at least one LED layer, each LED layer comprising a plurality of LEDs, where at least one LED layer is at least partly made of a polymer,
where each single LED layer comprises electrically conductive patterns, where the LEDs are electrically coupled with the electrically conductive patterns,
creating a layer arrangement for a single module by stacking the at least one LED layer and possible other layers in a desired order, and repeating the creating step in case of a plurality of modules are desired; and in case at least two modules are formed,
connecting the at least two modules together in order to form the apparatus.

In one embodiment of the manufacturing method, printing the electrically conductive patterns and component assembling steps are performed with a roll-to-roll method.

In one embodiment of the manufacturing method, stacking the layers on top of one another, where each LED of a LED layer will be accommodated in a corresponding hole of a next layer, or vice versa.

In one embodiment of the manufacturing method, placing or spraying or injection molding a protective layer on at least a part of the surface area of the apparatus.

In one embodiment of the manufacturing method, stacking a first layer arrangement in order to achieve a first single-view apparatus with at least one LED layer, stacking a second layer arrangement in order to achieve a second single-view apparatus with at least one LED layer, flipping the second layer arrangement 180 degrees, and attaching the first layer arrangement with the flipped second layer arrangement in order to achieve a dual-view apparatus.

In one embodiment of the manufacturing method, stacking four LED layers, with each LED layer having a first distance between LEDs in both X- and Y-directions on the surface of the LED layer, on top of one another so that a first and a second LED layer have a misplacement in an X-direction, and a third and a fourth LED layer have a misplacement in an X-direction, and stacking these two pairs of LED layers with a misplacement in a Y-direction, resulting in a LED layer structure which has half of the first distance between LEDs in both X- and Y-directions on the surface of the LED layer structure.

In one embodiment of the manufacturing method, stacking a plurality of LED layers, where LEDs (52) on each of the LED layers (51a-e) have an identical distribution, and when stacking the LED layers in a misplaced manner, achieving a LED layer structure where the LEDs have a uniform distribution in X- and Y-directions on the surface of the LED layer structure.

In one embodiment of the manufacturing method, the possible other layers are taken from the group of: a solar panel layer, an electrically conductive pattern layer, a battery layer, a holed film layer, a physical support layer, a protective layer, a thermally conductive layer, a thermally insulating layer, a diffuser layer, a reflective layer, an electroluminescent emission layer, or a sensor layer comprising at least one dedicated sensor.

BRIEF DESCRIPTION OF THE DRAWINGS

FIG. 6a illustrates a pinhole for the pin in a single layer with a conducting wire, FIG. 6b illustrates a connection principle for a 4-layered structure, FIG. 6c illustrates a cross-section of the pin-connected screen modules with inter-layer conductivity between two different layers of two adjacent screen modules.

DETAILED DESCRIPTION OF THE EMBODIMENTS

Figure 1:
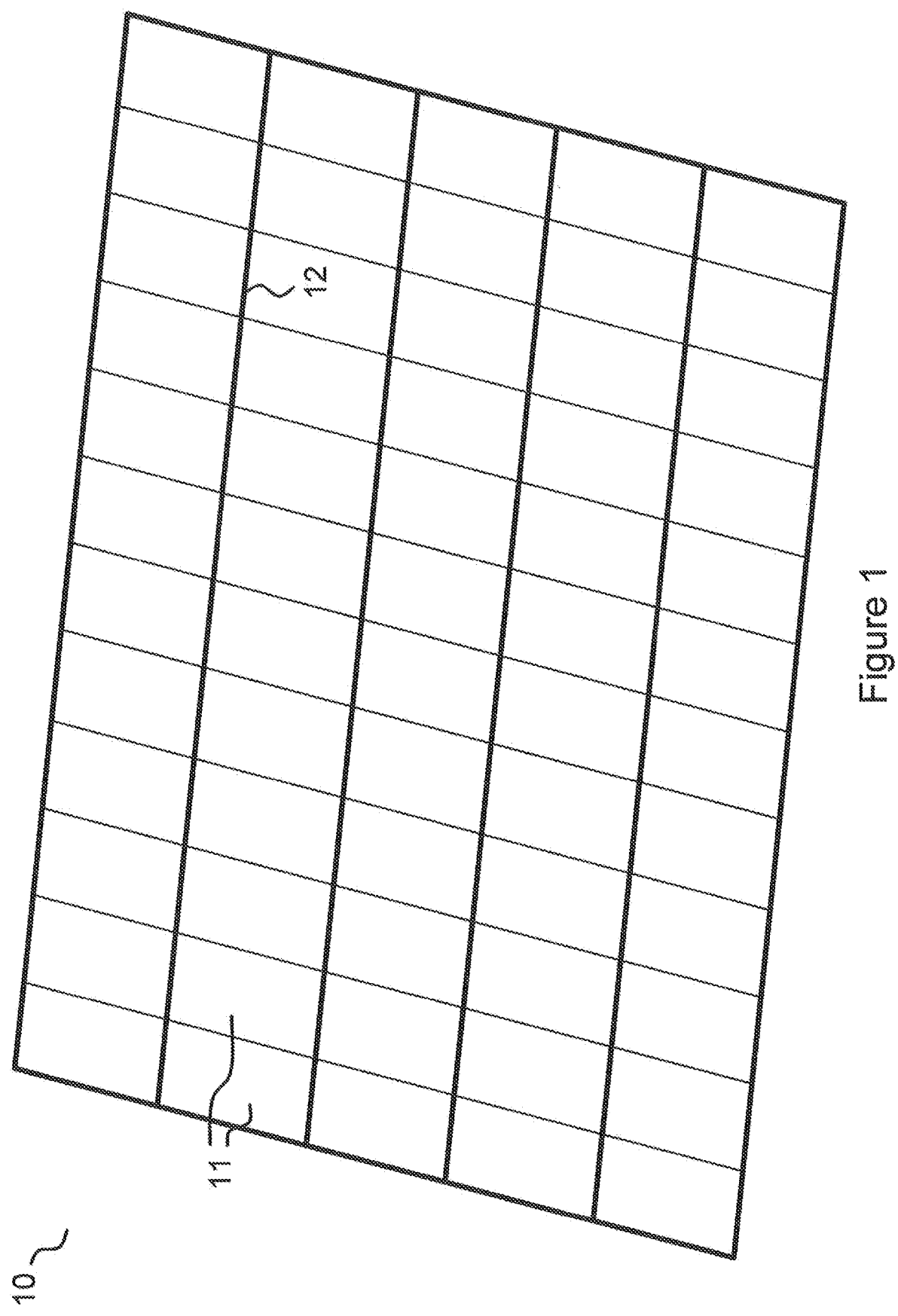
FIG. 1 illustrates a modular structure of a LED thin film screen.

The present invention introduces layered and flexible thin film based LED screen and illumination device structures to display full-color or black-and-white still images or video for visually displaying information, or for illuminating purposes. The device comprises at least one module where each module comprises at least one layer where different layers may have different functionalities. In the following, where merely the screen structure is discussed, it is meant to include both the displaying devices and illumination devices. The screen structure may comprise a LED layer comprising a plurality of LEDs and desired electrical circuitry meaning electrically conductive patterns with contact areas for components. In case the structure comprises several LED layers, the corresponding structure is referred as a LED layer arrangement. In a similar fashion. In some embodiments of the invention, the structure may comprise electric energy collecting means such as e.g. a solar panel, and electric energy storage means such as at least one accumulator unit or battery. All these functions may be implemented with a single main functionality per a corresponding layer, e.g. a battery can be formed through having one or more battery layers among the layered structure. In case the structure comprises several battery layers, the corresponding structure is referred as a battery layer arrangement. The battery or batteries can preferably be rechargeable, which can be used for storing solar energy, for instance. Alternatively, instead of a battery layer (arrangement), an external battery means may be used. A single electrically conductive layer may be patterned for creating conductors of an electric circuit which enable the operation of the screen or illumination device. In an example, electrical circuitry comprises the input supply of the electric current for the LEDs, and also a control signal which is used to drive the LEDs in order to create the desired image. Because LED types are various, it is meant that appropriate wirings of electrical conductors are selected for the selected LEDs. Of course, different layers require dedicated electrical circuitry as well. In the invention, the electric supply can be provided from mains current to the LED screen. In another embodiment, the screen structure has an independent electric supply creation means, e.g. through a solar panel layer along the structure. A part or all these functional parts can be implemented as a layered element or by connecting or adding elements or material onto a layer where a single layer can be manufactured as thin, transparent and flexible, and the surface dimensions of a single layer are freely scalable and selectable according to the used application.

In the present invention, the used LEDs in the structure are non-organic LED components. Furthermore, the used LEDs may be encapsulated one or multi-color SMD LED components, or alternatively bare LED chips may be used.

The screen structure comprises at least one layer manufactured from a polymer like plastic, or from several different polymers. In the following where plastic has been disclosed as an example, a polymer material is generally meant to be used as a base material for a single layer. Plastic layers can be formed e.g. from polyimide, PET, PEN, polycarbonate or liquid crystal polymer. The electric circuitry can be formed through circuit patterns on top and/or on bottom of the plastic layer by using etching, transfer printing methods, a combination of evaporation and electrolytic deposition, patterning through mechanical machine tooling or laser ablation, or by printing with at least one printable conductive ink. In addition to traditional conductive materials such as copper or silver, other conductive materials such as ITO (indium tin oxide) or GraphExeter can be used in electrically conductive patterns. The polymer materials itself have many advantages, because it is light-weighted, it can be manufactured as a thin element, and it is capable to bend and even twist into different shapes, and placed onto or into a specially shaped physical structure without breaking. Furthermore, many plastic materials are also transparent in view of visible light so that light emitted by the LEDs can propagate through the plastic layer without too much attenuation. As a result, the whole structure can be made transparent to a certain extent which is helpful in many of the embodiments.

In one embodiment, a plastic layer can be provided with small through-holes, where the hole diameter and density (number of holes) per surface area can be freely selected. The use of holes will enhance the transparency regarding the visible light, and it also provides possibilities for the air and water to penetrate through the plastic layer if it is a desired feature of the screen structure. Also as a beneficial embodiment, the size and shape of a hole within a plastic layer is selected to fit with a LED of an adjacently locating layer. This means that the LED of a next layer will be fitted into the hole of the layer, resulting in a smooth and bumpyless planar structure. In this embodiment, the number and density of holes within a surface is thus at least the number and density of LEDs within a single layer. When the layers are stacked on top one another, there can be a hole in all other layers within the location of the LED in a single layer, resulting in a good visibility of the LED through the layered structure even if the number of layers is larger.

In case a simple one-layer structure is used as a platform for the LEDs, it does not necessarily need to include any holes because the lack of any adjacent layers. Still, if holes are used in the one-layer structure, it would enhance e.g. transparency.

In one embodiment of the invention, it is referred to a modularly formed LED screen structure shown in FIG. 1. The illustration exemplifies a LED screen 10 where the LED screen comprises a plurality of screen modules which are fixed on a frame structure 12. The frame structure 12 is preferably a rigid element and it can be shaped in a planar or non-planar shape. In one example, it is possible to install power supply and signal cablings inside or along (placed on top of) the frame structure 12, where they are also better protected from physical twisting movements or harmful moisture, for instance. A single module 11 of the whole structure may be a longitudinal strip, or it may be a piece-like module with desired dimensions. In FIG. 1, the frame structure 12 comprises horizontal bars within a rectangular frame. The modules 11 are shown as vertical strips and they are placed adjacently with each other so that all strip-shaped modules are placed orthogonally in view to the horizontal bars of the frame 12. In that case, the modules 11 can be fixed to the frame 12 in locations, where these two elements intersect.

The frame structure 12 can comprise electrically conductive wires, which can be connected to desired locations of the modules. Alternatively, some sections or the whole frame structure can be built without wires, and especially, if only a single module is used in the apparatus.

In another embodiment, it is possible to place modules 11 in parallel direction with the horizontal bars of the frame 12 (not shown in FIG. 1). In that case, the edges of the each module 11 can be fixed to the frame 12 along the whole edge, or just in designated locations along the edge.

In one embodiment, the strip-shaped modules 11 or piece-like modules can be attached to the frame 12 by using a plurality of connecting means. The connecting means may be made of either conductive or insulating material. The connecting means may be e.g. pins, but various other elements can also be used for this task. For simplification, pins are discussed in later embodiments. In practice, the two adjacent modules can be both attached to the bar of the frame 12 with a linear assembly of pins. The pins can be electrically conductive, and they can be used for instance for feeding electric supply carried by the wirings in the frame structure to certain designated points in the screen structure. However, some of the pins may be insulating (i.e. non-conductive) material, and such pins may be used in attaching the modules to the frame structure. Thus, the pins may be either conductor pins or insulator pins, and this applies to other used connecting means as well.

Concerning alternative options for pins, other connecting means such as screws, studs, spikes, crimp connectors or also other connecting arrangements can be used.

Concerning the example of FIG. 1, the pin connection points can be selected e.g. in the "corner points" where the edges of a module coincide with the frame sections. Additional connection points between the pins and the frame structure can be selected along the seams between two adjacent modules, or along the frame sections, e.g. with uniform spacings.

In another embodiment, the pins can be arranged to fix several layers together e.g. in a line-shaped arrangement. It is possible to place the pins through e.g. one or two overlapping layers and fix these layers onto the frame. This is especially beneficial with the layer structure where layers are a little bit misplaced between each other, in order to place the LEDs uniformly to the whole structure. These aspects are disclosed in more detail in connection with FIGS. 4 and 5*a*.

One option for supplying additional electric current to the screen structure can be created by placing additional electrically conductive patterns on one or both surfaces of a given plastic layer. Such a plastic layer may be specifically used just for the electrically conductive patterns. Another option is to add these electrically conductive patterns to other functional layers which already e.g. comprise LEDs and the related circuitry regarding the controlling of the LED screen output. Generally, the conductive patterns for the LED power supply can be implemented in any of the layers because different layers can be electrically connected between modules, see the later disclosure. Electrical power supply wirings integrated in the frame structure will help in providing the electrical power supply in a uniform fashion across a larger screen structure. Also wirings for other desired purposes may be added in the frame structure. These other purposes may be used for a control signal or for carrying some measurement signals achieved through dedicated sensors.

Figure 2:
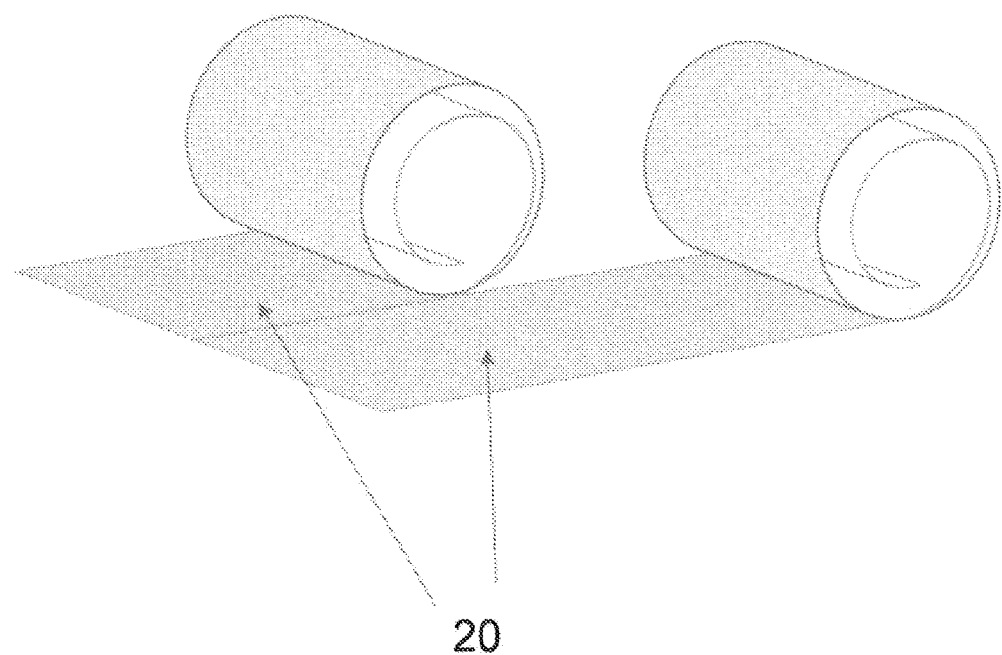
FIG. 2 illustrates a construction principle for modules of the LED screen.

In the following, the screen structure is discussed without incorporating any rigid frame as a support structure for the layered screen. Instead, the focus is in the layered structure of the film-based screen, and also in the protective means used to protect the layers from external substances and also for fastening the strips better together. This kind of a simplified structure is illustrated in FIG. 2. A single functional layer of the whole screen can be comprised of several strips 20 or bands of thin film. Such a plurality of parallel and longitudinal strips 20 in a single plane can be placed together with butt joints which are formed along the side edges of the strips, i.e. the strips 20 can be placed on a single plane in a parallel arrangement without any gaps between the edges of the strips or any overlapping sections between two adjacent strips of film. FIG. 2 shows the installment of the strips 20 by placing longitudinal strips besides each other so that long edges of the strips will be placed adjacently with a butt joint. The length of the strips 20 can be selected according to the desired application, i.e. according to the required screen dimension; in other words, the strips can be cut in a desired length. In one embodiment, the seam formed as a butt joint can be secured together by a tape or other adhesive band placed on top of the butt joint. In practice, such a tape is added beneath the layered structure to cover the seam.

In case only a single functional layer is constructed through a plurality of narrow film strips for the LED screen structure, there needs to be some appropriate bonding means within the structure which connects the film strips together. This can be implemented by placing protective strips of film in an orthogonal direction on top of the butt joint strips. Alternatively, the protective film strips can be placed below the functional layer of the LED screen. Of course, in an embodiment, the protective strips may be placed on both surfaces of a single strip which makes the structure even more protected. It is beneficial that the protective strips of film are transparent. Protective strips may be added to the structure either to a single module, or to the whole screen or illumination device.

The layer shown in FIG. 2 need not to be formed from longitudinal strips but instead, it may well be manufactured as a single planar film-like element in desired size and dimensions.

Figure 3:
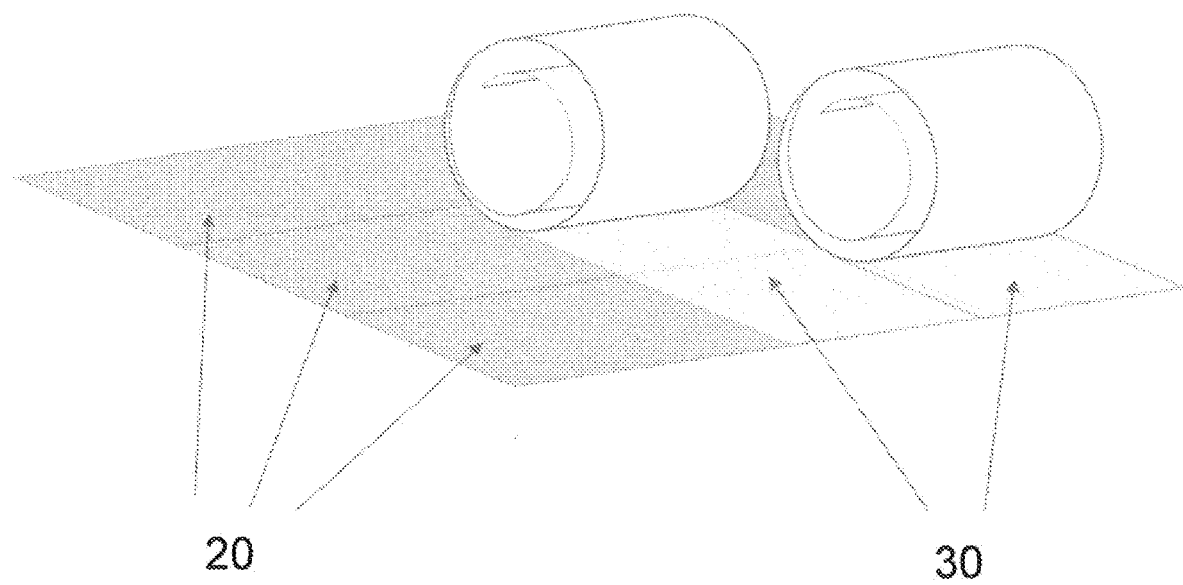
FIG. 3 illustrates a structure comprising protective strips of film.

The simplified embodiment with a single-sided protection and connection is illustrated in FIG. 3. After the desired number of strips 20 have been put in place e.g. on top of a working face used in assisting the manufacturing work itself, protective strips of film 30 can be rolled over the strips 20 in an orthogonal direction as it is shown in FIG. 3. Another possibility is to place the protective strips of film 30 in a same direction on top of the strips 20, but misplaced so that the butt joints of the strips 20 will locate below e.g. the inner part of the protective strip 30 (i.e. not exactly below the seam). The protective strips 30 can be placed in an adjacent manner, one by one, next to the previously set protective strip. The resulting structure is a more robust one and also more secure laminated structure which keeps the possible moisture and dirt better off the functional LED layer regardless of the application area or the location of the LED screen.

Regarding the material of the protective strips or a protective layer or tape, it can be made of plastic, epoxy, silicon or generally from one or more synthetic polymeric material.

Such a protective layer may be created through spraying liquid material such as insulating protective lacquer. Another kind of protective layer may be manufactured through spraying or injection molding e.g. plastic on top of the screen structure, resulting in a plastic covered screen structure. Such a plastic layer may be shaped appropriately with the screen structure, in order to create e.g. a desired 3-D shaped form for a base object, provided with a screen structure on an outer surface of the base object, and a protective layer on top of the screen structure. Generally, the protective layer is at least partly transparent and it protects the laminated screen from e.g. dust and moisture. Regarding the shapability of the laminated screen into different shapes, it will naturally diminish as a function of the increasing thickness of the laminated structure. By selecting an appropriate plastic type and a suitably small thickness of a single layer, this aspect can be improved for multi-layer structures.

In another embodiment, there can be a small gap between two adjacent strips of active layers 20, instead of a butt joint. Because the protective strips 30 will fix the layered structure together after their installment, such a gap is not harming the robustness of the layered structure. Instead, it makes sure that no overlapping edges will locate on top of another layer when the layered structure is manufactured.

Regarding the protective strips of film 30, they can be installed with butt joints between the long edges of one another. In an alternative embodiment, the protective strips 30 can be placed in a slightly overlapping fashion when considering the adjacently locating strips. If such a structure is placed in an inclined position, the overlapping structure of the protective films ensures that e.g. water flowing on top of the screen structure will flow along and out of the surface of the structure without entering into the structure, i.e. between the layers. The protective strips 30 thus resemble roof tiles of a ridge roof in its principle regarding the flowing water on top of it.

The stacked layers according to the invention can be provided with a protective layer on top of all the layers, either one-sidedly or dual-sidedly in case of a dual-sided screen. In case holes are used in the layers, each LED will be topped only by the protective layer, making the transparency of the structure uniformly good, because different LEDs will be attenuated only by the attenuation of the protective layer.

In another embodiment of the whole screen structure, the structure can be manufactured through applying several LED film layers stacked on top of each other. The result is a multi-layered, or in other words, a laminated structure. In one example, each film layer can be a piece of plastic layer with appropriate number of LEDs attached to it with selected distances between the LEDs. Different layers may be identical or there might be some differences e.g. regarding the LED density along the layer surface. The structure may also comprise intermediate layers which do not incorporate any LEDs. The layers may comprise holes so that the LEDs of an adjacent layer can be positioned in the holes of the subsequent layer, in order to enable a uniformly thick layered structure. The details of the structural options are discussed later.

The stacked group of layers may comprise a diffuser layer. The protective layer on top of the stacked layer group may act as a diffuser as well. Still, the diffuser layer may be a separate layer among the stacked group of layers. The diffuser layer smooths the emitted light in order to enhance the visual experience of the screen or illumination means.

The stacked group of layers may comprise a reflective layer which reflects the light emitted in a LED to a desired direction. Furthermore, an electroluminescent emission layer may be used.

In one embodiment, in addition to traditional manufacturing methods for electrically conductive patterns and assembling of components, the conductive patterns can be formed by printing with at least one conductive ink, and the assembling of components can be performed by using a roll-to-roll method. This comprises automated methods where electrically conductive patterns can be formed and the LED components can be assembled to the layer structure, and the structure can be moved into and from the manufacturing area in a controlled manner.

Furthermore, the manufacturing of the combined layer arrangement can be performed one module at a time or by using a roll-to-roll based method. With such a method, the layered structure can be created by adding one layer at a time onto the previously created layer stack. The next layer can be released from a roll and directed to the manufacturing area where the combining of the layers takes place. It is also possible that all layers are initially stored in a rolled or planar form and starting from such an initial position, they are simultaneously released into the manufacturing area. When the layered structure is finished and e.g. treated by heating, if desired, the complete layered structure can be set in a roll-shaped form again. This enables easy storage and transport for the complete layered screen structure.

Figure 4A:
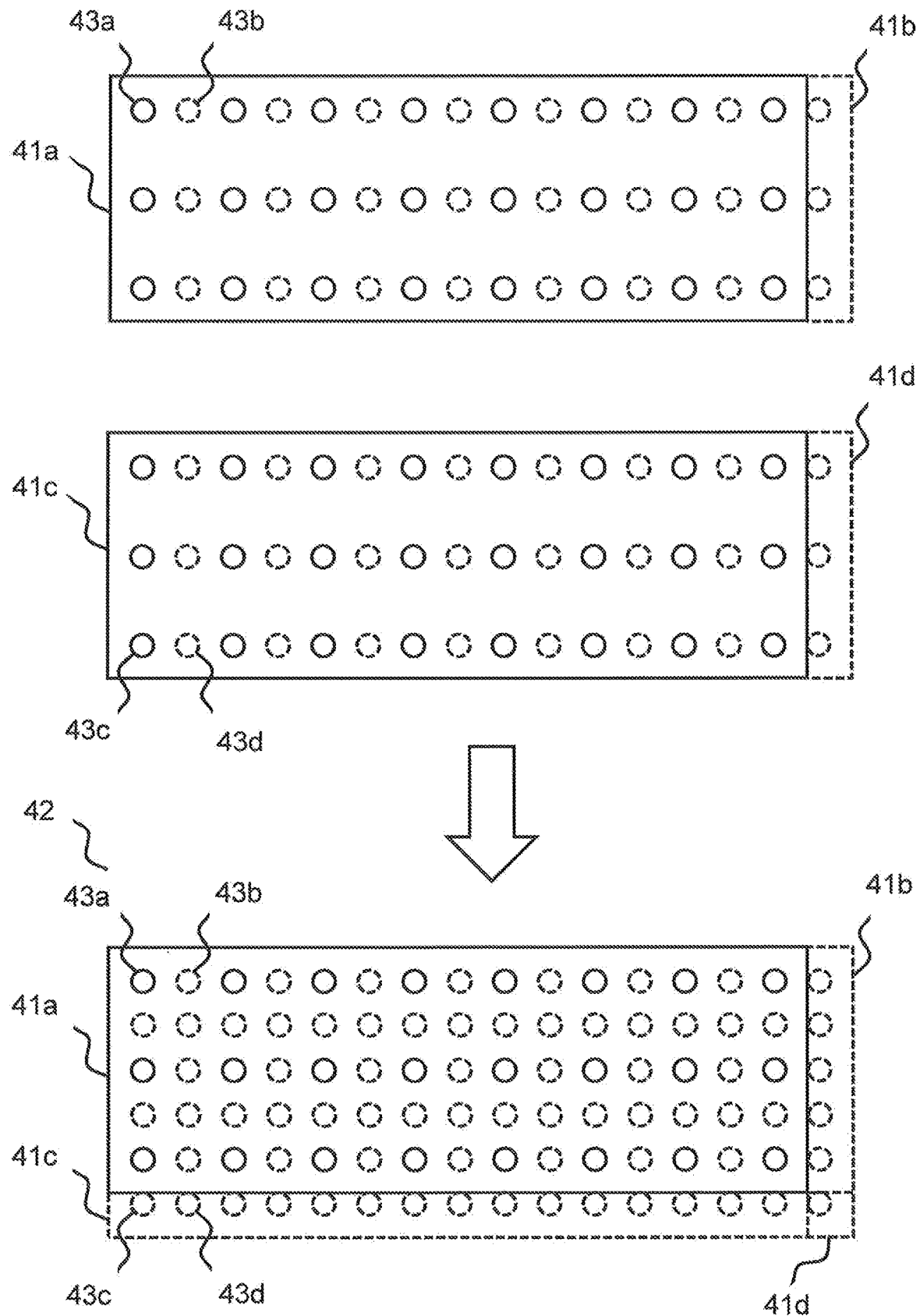
FIG. 4a illustrates a creation of a four-layered structure of the films comprising LEDs.

FIG. 4a illustrates a stacking principle for a plurality of layers in order to manufacture a screen structure, where each layer comprises a group of LEDs in this example. In this embodiment of the manufacturing method, a so-called twoplustwo layer structure is discussed. At first, two mutually similar film layers 41a, 41b are taken into use. The upper layer 41a of the pair comprises LEDs 43a (marked with unbroken circles), and their mutual distances in both the X- and Y-directions are the same, i.e. the LEDs are uniformly distributed across the plastic layer surface. The lower layer 41b is marked with dash lines. LED components are shown as elements 43b (marked as dashed circles) in the lower layer 41b. When these two layers 41a, 41b are stacked in a superposed manner, the layers 41a, 41b can be placed so that the LEDs 43a-b of two consecutive layers will not coincide on top of one another but the layers overlap in a misplaced manner. The misplacement length between the two layers is selected as half the distance of the two adjacent LEDs 43a. This is illustrated in the top illustration of FIG. 4a, where there are two overlapping LED layers 41a, 41b stacked on top of each other so that the locations of the LEDs 43a of the first layer 41a will alternate with the locations of the LEDs 43b of the second layer 41b, when looking at the structure from a top view. The resulting intermediate laminated film structure will have a double density of the LEDs, when looked at on top of the dual-layer structure. The middle illustration of FIG. 4a shows a further dual-layer structure, which has practically the same structure as above. The second dual-layer structure is formed from the third layer 41c provided with LEDs 43c, and the fourth layer 41d provided with LEDs 43*d*. The third and fourth layers are misplaced similarly as in the top illustration (i.e. moving the other layer in the X-direction).

Finally, these two dual-layer structures are stacked together so that there is a misplacement in the Y-direction between the dual-layer intermediate structures. As a result, a denser structure of LEDs is achieved in the final four-layer structure 42 shown in the lowermost illustration of FIG. 4*a*. The uniform line illustrates the top layer with LEDs and the dash lines show the other three layers with LEDs beneath it.

This results in a uniform structure and density among the LEDs which is highly desired in screen and illumination applications. Preferably, all of the layers are selected to be transparent except the lowermost layer may be either transparent or a non-transparent layer, in order to let the light emitted by the LEDs to propagate well through the layered structure. Because the films are highly transparent (preferably made of a polymer, or several polymers), the LEDs 43*b-d* in the lower layers 41*b-d* will have the same visibility in practice as the LEDs 43*a* of the top layer 41*a* have.

In an embodiment, the layers are provided with holes, such that the LED of a lower layer will be set below hole locations of the upper layers, resulting in higher visibility of the LED from the top of the structure. In this regard, FIGS. 8*d-e* explain these optional solutions in more detail.

In a single layer like layer 41*a*, the gaps between the adjacent LEDs 43*a* can be provided with holes regarding both the X- and Y-directions. These holes will then locate exactly on the LED spots of the other layers when the stacking has been completed for the layers. This enhances the transparency even more, and it also enables a smooth stacking for the layers even in the case, where the physical thickness of a LED component is relatively large. The hole size and shape can then be approximately the same as the LED size and shape in its outer edges, thus making a good fit for the LED into the space defined by the hole.

Figure 4B:
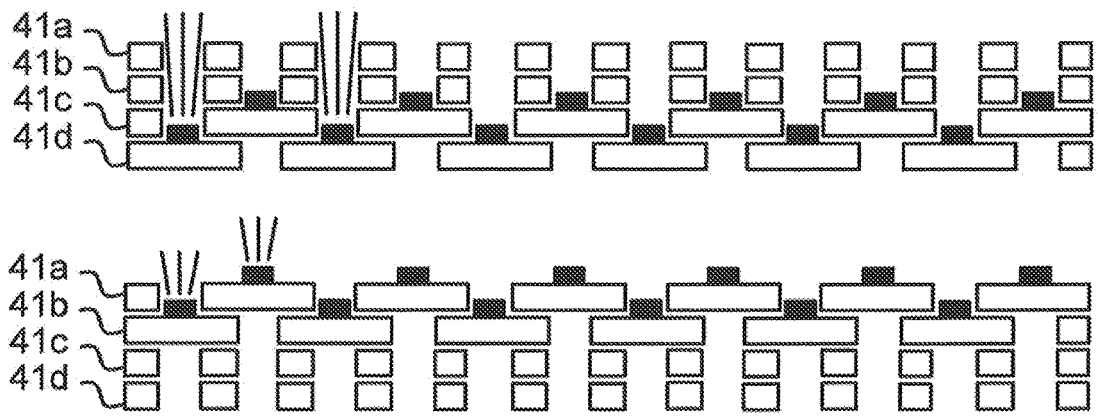
FIG. 4b illustrates a cross-sectional view of two adjacent columns of LEDs with holes in the four-layered structure of FIG. 4a, FIG. 4c illustrates an example of three stacked layers, where each single layer accommodates single-colored LEDs, for forming a single RGB pixel.

FIG. 4*b* illustrates two adjacent columns of LEDs according to the stacking principle shown in FIG. 4*a*. At first the upper image is discussed. For a first selected column of LEDs, the first two layers 41*a* and 41*b* are transparent polymer layers without LEDs in this column. Holes are provided in these layers in places where the LEDs may locate in the other layers. The layers with LEDs present in this column are layers 41*c* and 41*d*. The lower image of FIG. 4*b* shows an adjacent column to the first selected column of LEDs. In there, the layers with LEDs present in this column are the two uppermost layers 41*a*, 41*b*. The transparent polymer of the two other layers 41*c* and 41*d* are shown below the layers with the LEDs. Such cross-sections will alternate when different columns of LEDs are looked at. As a result, the LEDs locate at slightly different "heights" of the layered structure but when the structure is looked from greater distance on top of the planar structure, but such a difference can not be noticed during actual viewing.

In one embodiment, it is further possible to increase the LED density (and thus, the resolution of the LED screen) by the factor of four by repeating the process according to FIG. 4*a*. In this manner, e.g. a 16-layer screen structure can be manufactured with uniform distances between any two adjacent LEDs.

Both the 2-layer structure and the 4-layer structure have edge sections on their sides which can be used in connecting the screen sections or strips together. This can be performed by having an adhesive material in the inner surfaces of the edge sections. With inner surfaces, it is meant other surfaces than the top surface of the topmost layer or the bottom surface of the lowermost layer. With such an arrangement, it is not necessarily needed to use pins in connecting the group of layers modularly to one another. With glue or other adhesive used in the seams, the adjustability and flexibility of the screen structure is maintained. Of course, the connection of modules or strips with adhesive can be combined with the connection with e.g. pins into a metal frame, as shown in FIG. 1. This means that a single screen film strip of a module 11 of FIG. 1 can then comprise a multi-layer strip stack, such as the LED layer structure 42 of FIG. 4*a* (lowermost illustration).

Regarding the connection in the seams of the layers, an alternative solution to the use of adhesive material is to use an adhesive tape on top of the seam of the completely stacked layer structure. The adhesive tape may be a protective plastic strip or layer which is connected with adhesive material to the lowermost or topmost layer.

Generally speaking, the protective layer or means or even the tape on the seam area can act as connecting means between the modules.

In an embodiment of the invention, each used LED is an encapsulated RGB LED or an encapsulated RGBW-LED. Alternatively, the used encapsulated LEDs may be merely single-color LEDs, such as R- (red), G- (green), B- (blue) or W-LEDs (white). Alternatively, bare LED chips may be used instead of the encapsulated single-color LED chips. The required wiring and control method of the LEDs is selected based on the selected type of the LEDs.

Figure 4C:
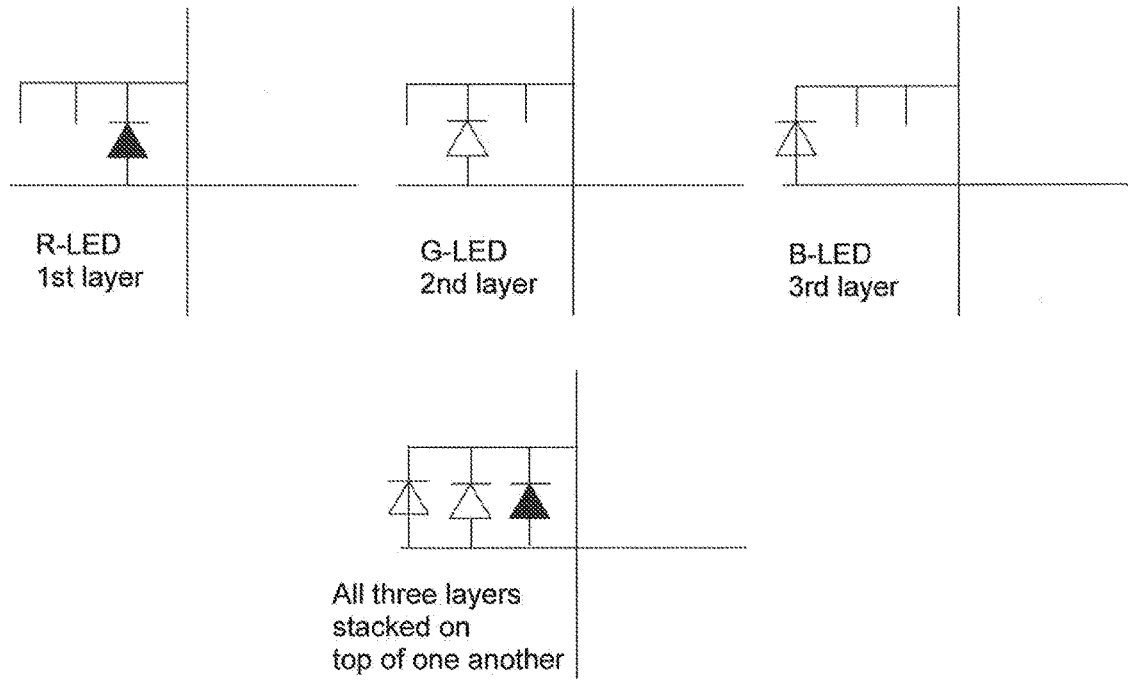

In one embodiment of the invention, a layer structure may comprise four LED layers, among which a layer of R-LEDs acts as a first layer, a layer of G-LEDs acts as a second layer, a layer of B-LEDs acts as a third layer and a layer of W-LEDs acts as a fourth layer. In a further example comprising three separate layers where a single layer accommodates single-colored LEDs, FIG. 4*c* is referred to. The first layer is provided with R-LEDs, the second layer is provided with G-LEDs and the third layer is provided with B-LEDs. Of course, the order of these layers for single-colored LEDs may be different than the above mentioned order. All these layers are provided with the same electrically conductive pattern capable of connecting between one another electrically. Thus, the vertical and horizontal wires of the matrix-type of pattern will coincide when the three layers are stacked on top of one another. As a result, an RGB screen or illumination device can be created by the layered structure by using different groups of single-colored LEDs.

According to yet another option of the invention, the LEDs of the first layer may be aligned 180 degrees to the other direction than the LEDs of the second layer, after the stacking. In other words, the pointing directions between these two groups of LEDs are then completely opposite to one another. Different possibilities for creating the dual-sided screen or illumination structure are discussed in connection with FIGS. 8*d* and 8*e*. This results in a thin film based LED screen structure which is double-sided and capable to show image information and/or illumination to two totally opposite directions. Such a structure has many interesting application areas, such as using them in two-sided advertisement signs, traffic signs or traffic lights. Further options comprise general information or guiding screens in public spaces, in advertising arrangements, or in various transport hubs such as train stations. The screen structure of the present invention may be used in architectonic media surfaces, such as placed within or on top of a window glass of any building or on other transparent "wall", or such as within a transparent overhead shade structure of an entrance door of a building, for instance. Other imaginable application areas comprise entertainment, cultural and artistical applications where illumination based effects and visual presentation is applied. These can be various, ranging from gaming applications (such as in escape games or in laser tag gaming areas) into cultural or educational venues (show arenas, theatres, sports venues, auditoriums, classrooms, lecture halls), and further into decorative or guiding uses in urban landscape (name signs within a store entrance) or even in designed attractions of an amusement or theme park.

Of course these different application areas may use a single sided screen or a double sided screen, depending on the application and also depending from the type of an object or surface where the screen structure is embedded.

Because the layer structure is flexible, the dual-sided screen structure is not merely restricted to planarly formed screens but also curved or otherwise shaped ones can be created as dual-sided screens. In one embodiment, the screen structure can be a segment of a cylindrical shaped form, e.g. a planar TV screen which has been reformulated in an arc-shaped form.

In cases where the screen structure is implemented for e.g. educational or business related use such as in a classroom or in a meeting room, the screen structure can be connected through wireless communication means to a portable or fixed device which can be accessed by a presenter in the room. Such a device can be a smartphone, a tablet or a laptop computer of a presenter or teacher who can then control the display screen information with such a portable device. Of course the controlling device can also be fixed in the meeting room or the classroom. These arrangements will replace the traditional writing boards and chalks/marker pens in the classrooms and correspondingly, the projectors and cinema screens used traditionally in various meeting rooms.

Generally, the screen structure according to the invention can be an IoT ("Internet of Things") device.

Figure 5A:
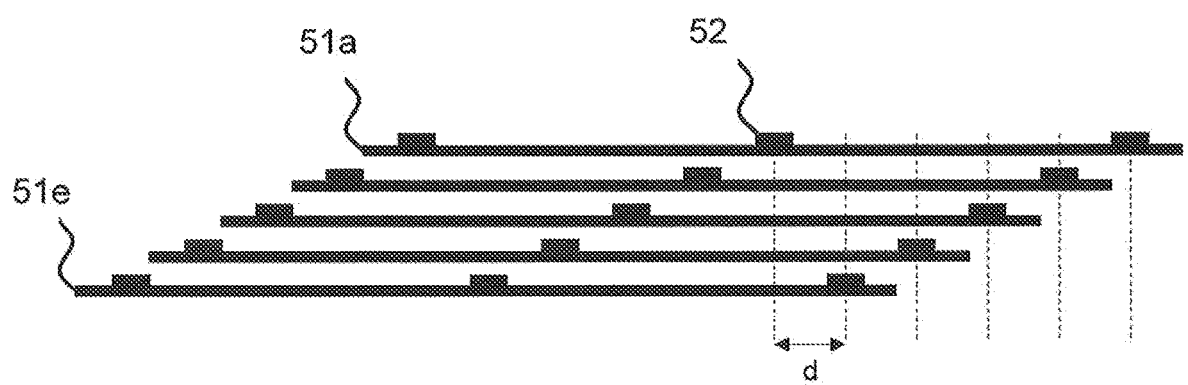
FIG. 5a illustrates a 5-layer structure in order to create a LED screen with a dense resolution, as a side-view.
Figure 5B:
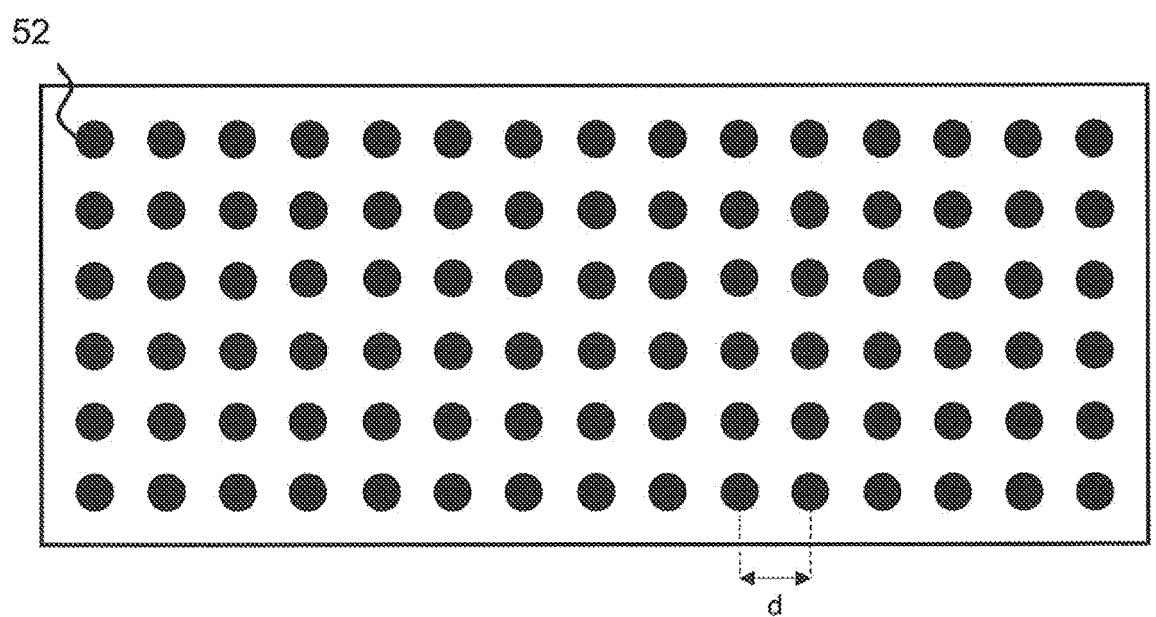
FIG. 5b illustrates the multi-layered LED screen of FIG. 5a as a top-view, with LED spots visible.

In a further example shown in FIGS. 5a and 5b, there are five LED layers 51a-e stacked on top of one another. A single layer acts as a single structural element for the screen structure which is constructed in the way discussed in the following embodiment. In this example, the five identical layers are each slightly misplaced compared to the previous layer so that the misplacement length is ⅕ of the distance between two adjacent LEDs of a single layer. The resulting stacked laminate structure 51a-e is shown as a top view in FIG. 5b, with the LED elements 52 visible. The resulting LED density is five times thicker than the LED density in a single layer. In one embodiment, such a laminated structure may further be covered from one or both end surfaces by protective strips or a protective layer.

In one embodiment, the LEDs 52 on a single layer 51a may be aligned in direct and parallel lines and the lines of LEDs may have a selected distance between them. By misplacing the other layers in a fashion disclosed in the previous paragraph, the resulting structure will have the lines of LEDs combined into a group of LEDs where all LEDs are uniformly distributed in both X- and Y-directions of the layer structure. When the laminated or stacked layer structure is looked at from an orthogonal direction to the surface of the layer structure, the LEDs locating on the lower layers will also be visible because the layers are at least partly transparent. The mutual distances of the LEDs are the same in both X- and Y-directions. In the example of FIG. 5b, one fifth of all the LEDs 52 locate as LED lines on layer 51a, and so forth.

By generalizing the idea of FIGS. 5a and 5b, the resolution of the screen structure can be effectively selected by choosing an appropriate number of layers with an identical LED layout, and stacking them on top of one another with a slight mutual displacement between each and every two adjacent layers, as shown in FIG. 5a. The transparency characteristics of the group of stacked layers will define the reasonable maximum number layers which can be stacked together. Furthermore, holes can be used in the layers, and it is also notable that the density of holes in the layers also affect the transparency of the layered structure.

In long structures (e.g. for long film strips as in FIG. 2) there is a possibility to include in the structure an intermediate layer which supplies additional electric current to the LEDs by placing electrically conductive patterns in appropriate contact points along the patterns of contact points of an adjacent layer. This enables the electric supply to be divided even more into a large screen structure, where a current of a single supply line remains within specified limits.

Alternatively, the electrically conductive patterns in the intermediate layers may comprise e.g. the control signal lines provided to the LEDs, and other circuit patterns e.g. relating to the sensor layers.

Further advantages of the multiple stacked layers is that the electric supply wires need to carry less electric current which enables even thinner wire widths. This further enhances the transparency of the whole structure. Also the heat generation by the LEDs and the conductive patterns can be handled more effectively because the heat is divided in multiple layers, and the heat will transfer from the heat sources in a more divided manner, increasing the reliability of the device as such.

FIGS. 6a-c illustrate further embodiments regarding the connection of layers with a plurality of pins. The holes for the pins in the plastic layer may have different shapes. FIG. 6a shows an inner design option for a pinhole 63 shown as a top view. The left-hand side of the pinhole 63 includes a sub-part 62a which is bendable. When the pin 64 is inserted in the pinhole 63, the sub-part 62a will bend downwards, ensuring an electrical connection between the pin 64 and the corresponding layer 61a with the sub-part 62a. Conducting wire 60a is illustrated as a horizontal thick line on which the pinhole 63 also locates.

FIG. 6b illustrates the stacked group of layers 61a-61d with each having a pinhole 63, and the pinholes have been aligned along the same line. The pinhole for the top layer 61a has a bendable sub-part 62a on the left-hand side of the pinhole. Instead, the pinhole for the second layer 61b from the top has a bendable sub-part 62b on the right-hand side of the pinhole. Conducting wires 60a, 60b are present in layers 61a and 61b, respectively. When the connecting means, such as a pin 64, is inserted into the aligned group of pinholes 63, the connection is achieved in this case between the conducting wires of the two uppermost layers 61a, 61b. With such a connection arrangement, different layers can be electrically coupled.

An example of such a connection is shown in FIG. 6c with the pin 64 and its fixing counterpart 65 in their places. The pin 64 and the near-by locating parts of the stacked layers 61a-d are shown as a side-view of the pin, as a vertical cross-section in FIG. 6c. In this structural embodiment, electrically conductive patterns of selected layers of the same module and/or adjacent modules can be electrically coupled between one another. In FIG. 6c, the uppermost layer 61a of the left screen module has a sub-part 62a towards the left-hand side of the pin 64, and this layer comprises the conducting wire 60a. The second uppermost layer 61b has a sub-part 62b bent towards the right sidewall of the pin 64, and this layer has the conducting wire 60b.

Layers 61c and 61d are here non-conductive layers. In this way, two uppermost layers 61a, 61b have an electric coupling to the pin 64 and thus, the two uppermost layers 61a, 61b have an electric coupling to one another, but the other layers 61c, 61d are not electrically coupled to either of them.

It is possible to use a conductive adhesive material, such as conductive glue, between the conductive pin 64 and any layer with the conducting wire 60a, 60b, in order to enhance the electrical coupling between these two elements.

In case different layers of the same module are coupled together with the pin connection method discussed above, the pinhole such as the one shown in FIG. 6c may locate on any part of the inner surface of a module (i.e. not necessarily on the edges of the planar layers). In case two adjacent modules and their layers are coupled together, the pinhole preferable locates on the seam area of these two modules (i.e. on the edge of both modules). With such a connection method, there are significant advantages because the connectivity between different modules makes the system very scalable in its size. Also the thickness (number of layers) is largely scalable. These aspects result into the fact that the size and the resolution of the screen can be varied a lot in view of the used application.

Also, connecting means such as pins can be made of a non-conductive material, where the connecting means physically connect the at least one module with the frame structure.

As an example referring back to the embodiment shown in FIG. 4a, the connecting means may be used to connect the layers 41a and 41b together. Alternatively, the connecting means can be used to connect the layer pairs 41a, 41b and 41c, 41d together, when creating the 4-layer structure from the 2-layer structures. A further option is to combine the finished modular pieces together with the connecting means, no matter how many layers the final screen structure module comprises.

Figure 6D:
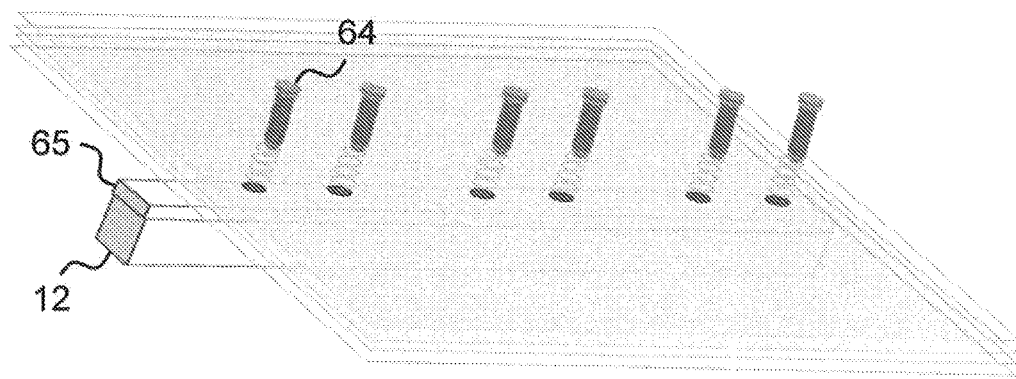
FIG. 6d illustrates an example for connecting a single module with a 4-layer structure to the frame with a plurality of pins.
Figure 6E:
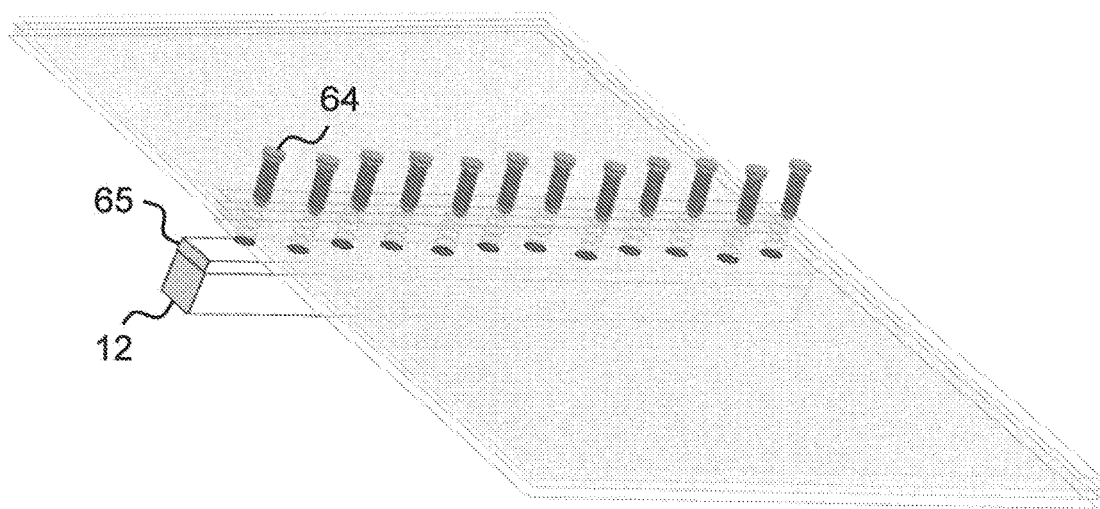
FIG. 6e illustrates an example for connecting two adjacent modules with 4-layer structures to the frame with a plurality of pins.

FIGS. 6d and 6e show two examples where the layers are connected to a frame 12. In FIG. 6d, a single module with four layers is fixed to a frame section by a plurality of pins 64. At first, the four layers can be fixed together by placing the layers between the pin 64 and its counterpart 65. Then the counterpart 65 can be attached to the section of the frame 12. The pins 64 can reach into the frame 12, in order to enable the possible electrical conductivity between an internal signal wire within the frame 12 and at least one of layers through the conductive pin 64 (as discussed in connection with FIG. 6c). Of course, the number of layers can be selected freely, and also a single layer can be fixed by this way onto the frame 12.

The structure of FIG. 6e fixes two adjacent four-layered modules onto the frame 12 by a plurality of pins 64 in the seam area of the two modules.

Figure 6F:
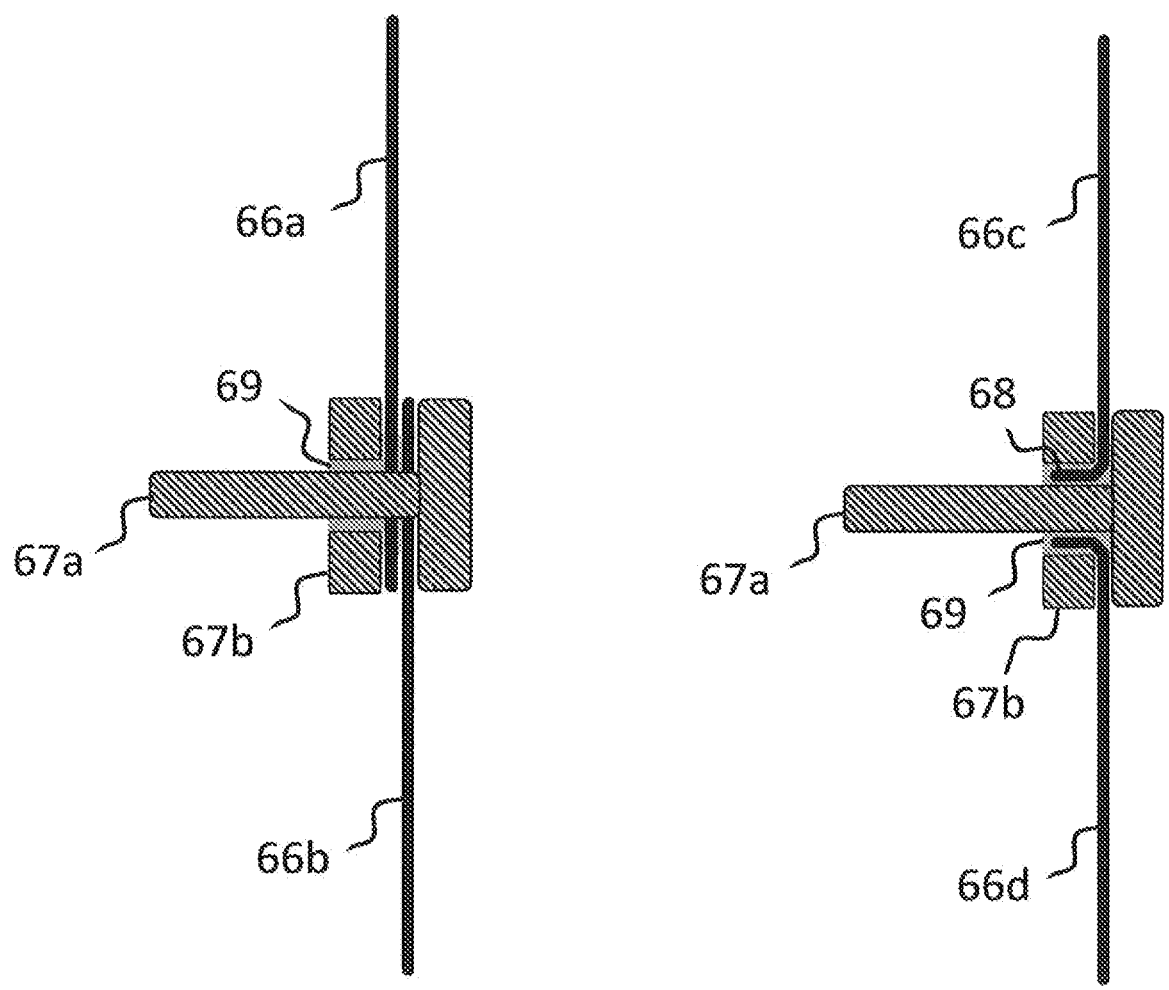
FIG. 6f illustrates examples of connecting two modules with a pin, a counterpart and adhesive glue.

FIG. 6f illustrates examples of connecting two modules with a pin and adhesive glue. The left-hand side image shows two modules 66a-b, one module 66a above and another module 66b below the horizontally directed pin 67a. The pinhole is made in both modules 66a-b and the pin 67a can be attached through the hole. A counterpart 67b can be used in fixing the connection with the pin 67a. Adhesive 69 such as conductive glue can be placed between the modules 66a-b and the pin 67a, and the adhesive acts as a reinforcing means for the location of the connection, and also for enhancing the electrical coupling between the modules. In the right-hand side image of FIG. 6f, the end sections 68 near the seam of the modules 66c-d are folded along the sides of the pin 67a. The gaps between the folded module end sections 68 and the pin 67a can be provided with conductive glue 69. The pin 67a can also be some other connecting means, such as a screw, a stud or a crimp connector. The cables and conductive wires within the frame structure can be placed in contact with the conductive wires or patterns of the modules through conductive pins and with conductive glue assisting in the contact points. Furthermore, a module may be connected to the frame structure also in somewhere else than in their seam area. In case there is no need for electrical coupling, the pin can be an electrically non-conductive pin.

Figure 7:
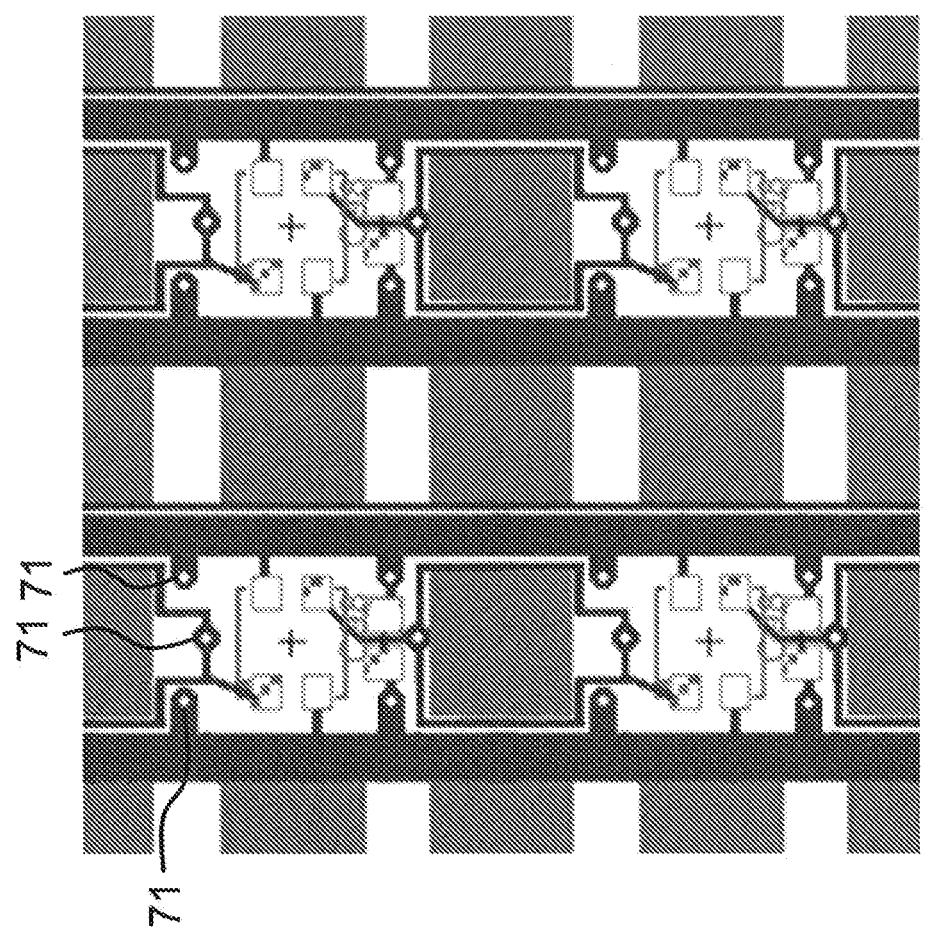
FIG. 7 illustrates an embodiment of a printed pattern on the layered structure with pin locations shown along the electrically conductive patterns.

FIG. 7 illustrates an example of a printed electrically conductive pattern achieved through a multilayer structure and showing the above pin-mediated connection locations. Pin connection locations are shown as 71 along the circuit pattern. The rest of the patterns form the desired circuitry applied in the selected use of the layered screen structure. The large square-shaped areas between the thick vertical wires are holes which are meant to be aligned with the LED part of an adjacent layer, as discussed earlier e.g. in connection with FIG. 4a. FIG. 7 illustrates circuitry used in this particular example, and the white area below the illustrated pin connection locations represent the space reserved for the LED.

Figure 8A:
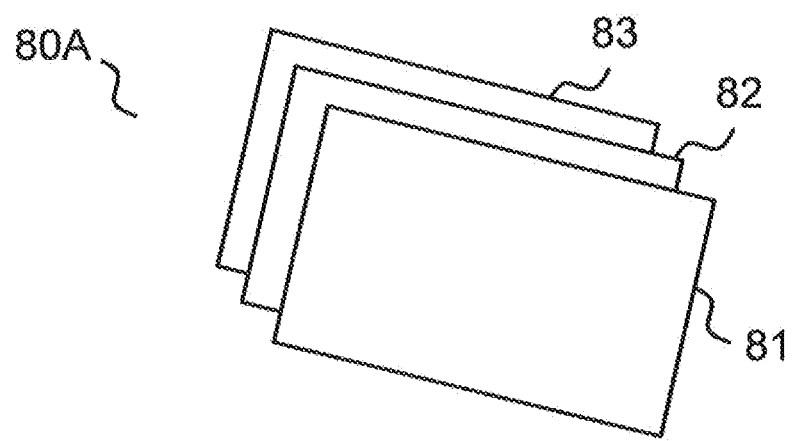
FIG. 8a illustrates a three-layer example of the screen structure.

Different application areas and desired layer structures are discussed next in connection with FIGS. 8a-e. In a first example of layered structure with designated functional layers, there is a 3-layered structure comprising a LED layer 81, solar panel layer 82, and a battery layer 83. The battery layer can preferably be a rechargeable battery. Such a structure 80A is shown as a simplified structural image of FIG. 8a. Depending on the selected application, the LED layer(s) 81 act either as screen means or illumination means. The LED layer 81 is made of transparent material. Beneath the LED layer there is the solar panel layer 82, which receives solar energy in an almost uninterrupted fashion because of the transparency of the above placed LED layer. Beneath the solar panel layer 82, there can be one or several battery layers 83. In the FIG. 8a, there is a single battery layer 83. The structure 80A of FIG. 8a is capable to show visual information and/or illumination and collect and store solar energy which can be used as energy supply. In this case, the LED layer 81 points to the outwards direction if this structure is used e.g. in a window. The circuitry details and electric supply wires are of course missing from this simplified illustration.

The application areas of the structure 80A according to FIG. 8a comprise applications where the screen is placed on a fixed wall, or on other non-transparent object. Various signs, guiding means and information providing means such as advertisement screens with either static or dynamic image information are possible. One possible option is to place the structure on a planar or curved object surface where the object might be formed from hard plastic which is injection molded into a desired shape and which can be provided with embedded circuitry and the screen sections formed by the present invention. Hybrid systems are a useful application area in this regard, and more details for these kinds of systems are disclosed later.

In the structure according to FIG. 8a and also the structures disclosed in the following, it is possible to neglect the battery layer, and use the screen or illumination directly from the energy achieved through the solar panel. In an alternative embodiment, an external battery may be connected to the structure, which is used to store and provide the electrical energy to the device.

Generally speaking, instead of a single battery layer, there can be also several separate battery layers used in the single screen or illumination structure.

The solar panel layer may be manufactured with patterned (shaped) active regions collecting light energy, and the active regions may be manufactured on a polymer film.

Figure 8B:
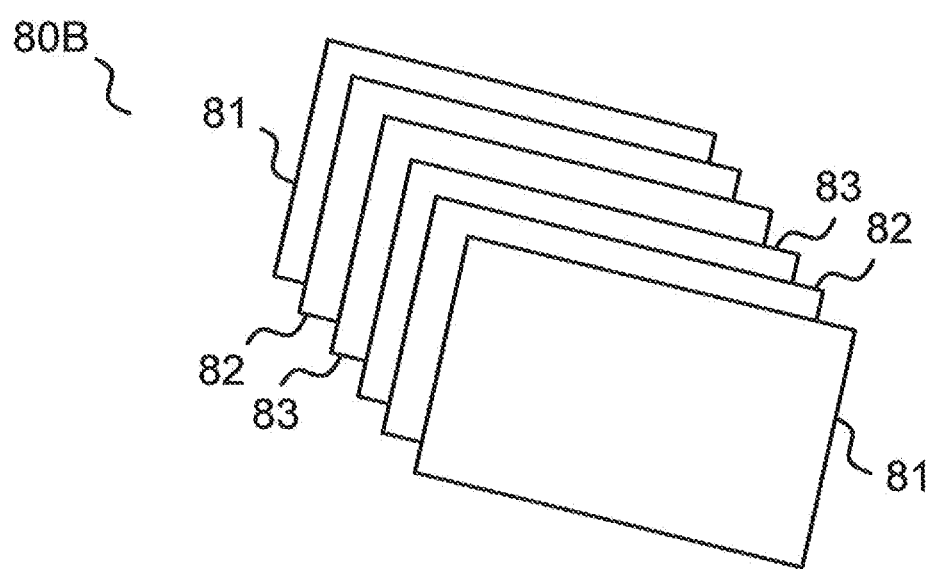
FIG. 8b illustrates a six-layer example of the screen structure.

In FIG. 8b, a double-sided screen structure 80B is illustrated as a simplified structural image. This structure has six layers. In this example, there are two separate screen structures which coincide with the structure of FIG. 8a, meaning that both structures have three different functional layers 81, 82, 83 stacked on top of each other. In the second example of FIG. 8b, another of these structures is flipped around 180 degrees and stacked on top of the other structure so that the battery layers 83 will be placed on top of one another. In this way, a double-sided screen structure 80B is created, where the layers from the top to the bottom are: 81, 82, 83, 83, 82 and 81. LED layers 81 form the outer surfaces of the structure, and they enclose the rest of the layers between them. Such a structure is capable to collect solar energy from both sides of the layered structure and simultaneously display image information to both sides of the structure, resulting in a dual-sided display.

In the double-sided application of the screen structure, the two displays may be controlled so that either one of the displays works at a time, or both displays work at the same time.

The application areas of the two-sided display are various. They can be used for instance in two-sided traffic signs, information signs or even traffic lights. Two-sided displays can be placed in or on top of transparent surfaces such as window glasses. In public outdoor use, the benefit of having a dual sided solar panel is realized when applying the display e.g. for transparent walls of a bus stop.

Figure 8C:
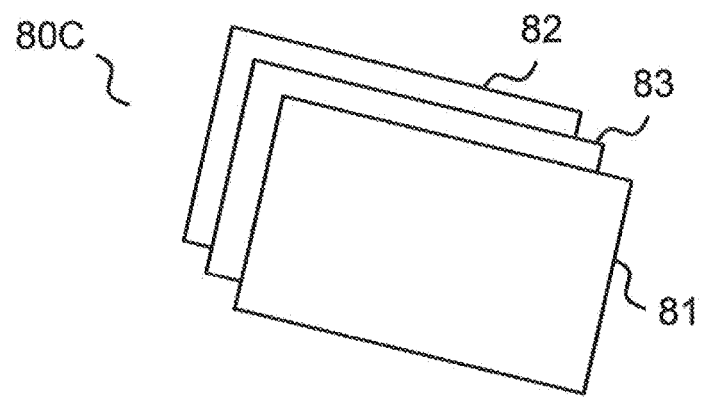
FIG. 8c illustrates another three-layer example of the screen structure.

FIG. 8c illustrates a further embodiment for the screen structure 80C, where the light energy can be gathered from a first direction and the visual display information is shown to a second direction, where these directions are 180 degrees opposite to one another. This type of structure can be used like a rolling shade in a window. In such a structure, the first layer is the LED layer 81, the second layer is battery layer 83 and the third layer along the stack is the solar panel layer 82.

When this screen structure 80C is placed e.g. on an outer window of a building, with the solar panel layer 82 pointing outdoors, a beneficial arrangement is achieved. The solar energy can be gathered directly because the solar panel layer points outwards to the ambient environment. The LED layer 81 will then provide the visual information or illumination internally within the room or space supplied with the window and the attached screen. Such a structure 80C enables visual screen means without any need for external wires from an external electric supply.

Furthermore, regarding the application areas which can be used in a form of a rolling shade, there are several different structural possibilities for the layers forming the screen. The actual screen structure layers comprising the LEDs may be incorporated in the window or on the window surface. In this embodiment, the screen structure with the energy gathering and storing means can be divided in two different elements, which are connected to one another. During daylight time, the rolling shade comprising at least the solar panel and the battery layers can be pulled down on the window, in order to let the solar energy to be captured by the solar panel layer. During the night time when the daylight is absent, the screen or illumination functionality can be turned on in the window in order to show a desired display content or alternatively, to switch on a illumination element which acts as a rectangular LED-based light source in the window. The battery and solar panel layers may be in a rolled state during the night-time, just like the regular rolling shades are normally during the daylight. Such a night-time functionality also does not let anybody from the outside to see through this window, ensuring privacy for the people inside the building, whether in private or office or other public use. The window discussed above may also be other kind of a transparent wall which may locate also in a non-vertical direction. Such a illumination arrangement is a cost-efficient manner to use solar energy for illuminating interior (regular window) and also exterior spaces (transparent wall outdoors). As an alternative or as an addition to illumination purposes, such a structure acts as a cost-efficient screen for e.g. advertisement or guiding purposes.

As a further option, the energy collected in the battery layer(s) of the screen structure through the solar panel layer(s), can be used to other devices, appliances or illumination devices locating e.g. in a nearby environment. For instance, the screen structure can be installed into a window of an office, while all or some of the other office lights may be supplied with the collected solar energy from the screen structure in the window.

As a further option regarding the structure of the different layers, it is possible to place the solar panel layer as the outermost layer. Of course, an additional protective layer can be set as a coating to the solar panel layer. The LED layer(s) may then locate under the solar panel layer. The solar panel layer may be patterned in order to achieve a display on a façade of a building, a design object for household use, or a sun shade e.g. placed on top of an entrance or window. The result can be a surface or object in public or private place where the solar panel with the screen (or a light) can be shaped or patterned unnoticeably on top of the structure.

The screen or illumination device structure according to any embodiment of the invention can be implemented in a printed hybrid system. This is achieved by injection molding of an object. The materials used here can be various, and synthesized materials such as plastic is a beneficial material in such applications because it can be used to create freely selectable support structures and forms for electric devices and the circuitry needed in them. In some applications, transparent plastic material such as acryl is of great use. In hybrid structures, printed patterns and sub-parts can be combined with traditional electric components. The printed hybrid system can apply wireless and IoT ("Internet of Things") connectivity means. All the various structural embodiments from the above disclosure may be applied. Alternatively, connectors for the external data transfer and/or current supply may be provided as an alternative or additional means for the wireless communication and for the possible internal power system such as a solar panel and a battery discussed earlier. Furthermore, specific sensors or e.g. an optical camera can be placed in connection with the screen or illumination device. Generally, the layered structures can be shaped and/or fixed in desired 3-dimensional shapes which is a great advantage. Also the integration of electronics into e.g. shaped plastic structures results in a robust, well-protected device which can be made also in a compact size if needed. Maintenance is also easier because the whole device is integrated into a single physical entity. Possible applications are incredibly various, like e.g. consumer electronics, car technology, traffic signs, traffic lights, information boards and medical diagnostic devices. Also decorative uses are possible for interiors and exteriors, and various design illumination products and also illumination arrangements used in arts are possible.

Further application areas relating to the hybrid systems comprise household and office design illumination devices or other household electronics devices which may have very special forms compared to traditional illumination fixtures and devices. For instance, veneered structures can act as an installing platform of a flexible layered screen module where the veneered structure may have holes or cavities where the LEDs are designed to locate. As one optional design, the screen structure may be placed along a desired surface made of wood where the LEDs point outwards from the surface. The size of the screen structure may be selected so that the input supply current to the illumination device can be connected to the supply wires of the screen structure. The screen structure can then be covered with a protective layer where the LED locations are either free (provided with holes) or the protective layer on the LED locations is transparent. In this way, the design is more robust and also more aesthetically pleasing.

In general, the flexible screen structure according to the invention can be implemented with wood-based structures or objects, instead of synthesized materials like acryl or other plastic materials presented earlier. In this way, designed illumination devices for interiors and exteriors, household furniture, electrical appliances and the like, and pieces of art can be implemented with the structures according to the invention. Also illumination and display arrangements in various cultural or entertainment venues and applications is possible, e.g. for stage lights of a theatre, or display arrangements in an escape game room, just to present a few examples.

Figure 8D:
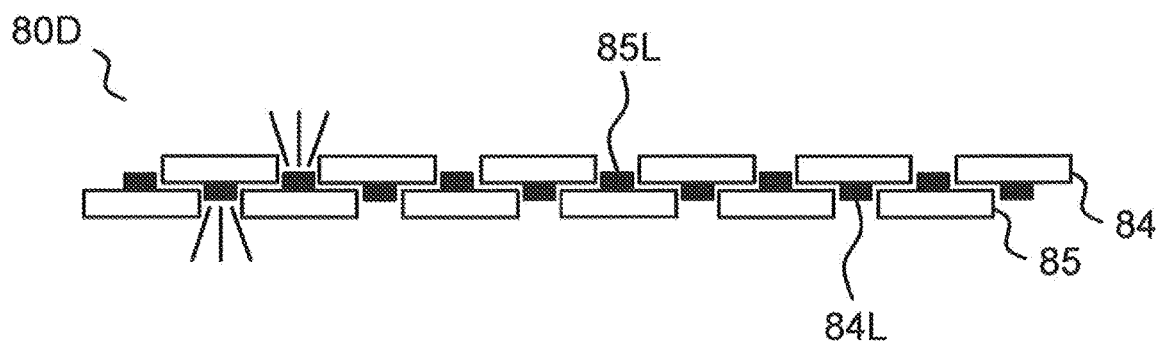
FIG. 8d illustrates an embodiment of a dual-sided screen and illumination structure with holes and viewing directions in two opposite directions from the thinfilmed screen structure.

A further embodiment is shown in FIG. 8d. This arrangement illustrates a two-layered structure with double-sided screen. The first layer 84 is the top layer and the second layer 85 lies beneath the first layer 84. Both layers are provided with holes placed within uniform distance from one another. The diameter and shape of the hole is selected so that a LED component can be placed at least partly in a hole. In other words, the size of the LED is slightly less than the size of the hole so that a LED can accommodate a corresponding hole, like a piece in a jigsaw puzzle. The two layers are provided with attached LED components, with the same mutual distance within one another as the above defined hole distance. When another layer is flipped 180 degrees around a horizontal axis, the two layers can be placed together, with LED components adjusted in the holes of the other layer. The LEDs attached to the first layer are LEDs 84L, pointing downwards in FIG. 8d. Correspondingly, the LEDs attached to the second layer are LEDs 85L, pointing upwards in FIG. 8d. The resulting structure has very little attenuation regarding LED light emittance because there is no plastic layer in the emitting direction of a LED. Also the structure is a robust one because of the jigsaw puzzle type of adjusting of the two layers. This is also a simple structure to achieve a dual screen functionality.

In yet another embodiment of the invention, the structure of FIG. 8d can be transformed so that the second layer 85 is flipped around a horizontal axis 180 degrees and the layer with LEDs pointing downwards can be placed in top of the first layer 84, with LEDs 85L placed in the holes of the first layer 84. In this way, a one-sided screen or illumination structure with doubled resolution can be manufactured. In a further embodiment, such a two-layer structure can be doubled so that another 2-layer structure points its LEDs in the opposite direction compared to the first 2-layer structure. In this way, an efficient dual-sided screen or illumination structure can be created. Finally, the number of layers can also be greater than two, in order to create a multi-layer structure for a single viewing or illumination direction (or twice that amount for a dual-sided screen or illumination element). Additional layers described previously in the description may be used in addition with the active layers with LEDs.

Figure 8E:
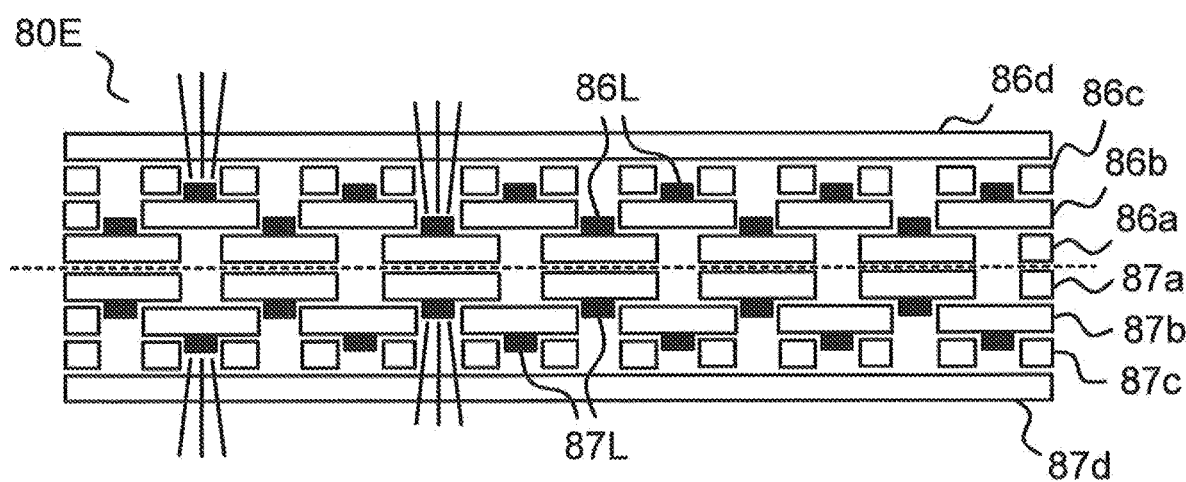
FIG. 8e illustrates an embodiment of a dual-sided screen and illumination structure, with two 4-layered structures placed with their backs facing each other.

The previous dual-sided embodiment is illustrated as a four plus four layer cross-sectional example in FIG. 8e. Layers 86a and 86b are stacked on top of one another so that LEDs 86L on a first layer 86a are placed in a hole of a second layer 86b. The second layer 86b is topped with an additional layer 86c where the LEDs 86L on the second layer 86b are placed in the holes of the additional layer 86c. A transparent protective layer 86d is placed on top of the stacked layers to protect the LEDs and the structure in general, resulting in a 4-layer structure for a single viewing direction. Thus, all LEDs 86L have direct visibility because the only layer required to be penetrated by the light of the LEDs is the protective layer 86d. The 4-layer structure 86a-d is doubled so that the second 4-layer structure 87a-d is flipped 180 degrees around a horizontal axis and attached on the back side of the first layer 86a. The line showing the attachment area between the two 4-layer structures is shown as a dashed line. The LEDs 87L thus point in an opposite direction than the LEDs 86L, when the arrangement is in a planar form. Also the other layer structure is topped by a protective layer 87d. The number and types of any intermediate layers can be freely selected. Also the number of LED layers for a single viewing direction can be one or more than two, as it has been disclosed in earlier described embodiments.

A yet further embodiment of the invention, and actually an application area for the presented screen or illumination arrangement is a screen or illumination device which can be placed below a layer of ice. This means that the screen structure with a single viewing direction can be placed on a fixed platform, such as on a concrete layer. In the ice application, the polymer layer or layers of the screen structure can be non-transparent, because the structure lies on a concrete or other solid base. There might be holes for the LEDs and even some additional holes in other parts than the LED locations of the structure in order to enable matter such as water or remaining air under the screen structure to flow through the screen structure in order to enable the water and/or air to exit the structure before the freezing takes place. This helps to make the structure as smooth and planar without any air bubbles trapped within the structure, thus easing the laying of the good-quality ice layer on top of the screen structure. The LED layer(s) need to be provided with a protective layer in order to prevent any water to enter into the structure. The screen structure acts as a platform for a next layer which may be an insulating layer. On top of the insulating layer, there can be a cooling layer for the ice. As an alternative solution, the cooling layer locates in the bottom within a concrete base, and the LED layer(s) are placed on top the cooling layer, without any insulating layer. In that way, the cooling will have an effect through the LED layers into the ice placed on top of the whole structure. Ice layer will be set on top of the final layer structure. In one embodiment, the screen structure can be located within the ice layer so that the distance of the screen structure from the top surface of the ice can be selected to enable the best view of the screen through the ice. The holes in the screen structure also help the cooling of the ice layer. The resulting effect is a screen or an illumination arrangement visible through ice.

In one embodiment of the ice application, the temperature of the ice layer can be measured and in case the temperature is above a given threshold value indicating a melting possibility for the ice, the control system of the screen structure can control and manage the output power fed to the LEDs. This enhances the quality of the ice through cooling the ice layer well under the threshold. The threshold can be slightly below 0° degrees, as an example.

In one embodiment, the screen or illumination structure may comprise a sensor layer using e.g. temperature sensors used to measure the temperature, or optical sensors used for visual inspection of the quality of the ice.

In one embodiment, which has benefits especially in temperature prone environments such as ice rink screens, the LED locations of the screen structure are covered by plastic bubbles formed in the protective layer. The plastic bubbles act as protective elements for the LEDs. The plastic bubbles may also help in drifting the thermal peaks of the structure in a more distributed manner across the screen structure.

The applications comprise different ice: covered arenas, such as ice hockey rinks. All the required lines and markings for the ice hockey games might be created through the ice-integrated screens. Also, it is possible to create various other lines and field limits for other sports than just e.g. ice hockey, in a multi-sports venue. This also applies for any indoor or outdoor sports field without any ice. Furthermore, the screens can be used in creating fixed or modifiable advertisement spots visible through the surface of the ice. The modifying capability of the created ads is a great advantage because there would then be no need to remove the ice when there is a need to change advertisements beneath the ice. Of course, the principles of the invention are well suitable to all other locations available in a sports venue, such as for guidance or advertisement means on the walls or windows or dedicated information screens in a sports arena, or as a main or additional result board within the venue or e.g. on rink walls or within a plexiglass surrounding the ice hockey rink. The options in this regard are plentiful.

Regarding the embodiments below a solid transparent material layer such as ice, the solid ice layer also acts as a diffusor element for the light sources. This means that single LEDs are not that easily visible farther away from the screen structure. Regarding the desired quality in the created images in the display, this might have an effect to the LED resolution within the screen structure, or to the thickness of the transparent solid material on top of it.

Generally speaking, the layers of the structure can be selected from this group of dedicated functionalities: a LED layer, a solar panel layer, a electrically conductive pattern layer, a battery layer, a holed film layer, a physical support layer, a protective layer, a thermally conductive layer, a thermally insulating layer, a diffuser layer, a reflective layer, an electroluminescent emission layer or a sensor layer comprising dedicated sensors. Sensors may comprise optical sensors, movement sensors and/or temperature sensors, for instance. In one embodiment, the optical sensors can be implemented in a form of a camera.

Summarizing different possible options in using the presented structure, the apparatus is used in printed hybrid systems, in architectonic media surfaces such as in or on a transparent glass or polymer wall, on a non-transparent wall, ceiling, floor or other planar or curved surface, in injection-molded elements or devices, in wooden or veneered structures, below an ice layer in ice rinks, in sports fields or arenas, in traffic signs and lights, in public transportation vehicles such as buses and trains, in guiding signs, advertisement arrangements, in decorative purposes, in a furnishing element used in a household or in public premises, in illumination devices, in IoT (Internet of Things), as a rolling shade on a window, in artistic purposes, in cultural and sports venues, in activity parks, theme parks, playing fields for children, in educational or business presentation purposes, or in gaming or entertainment applications.

The screen or illumination apparatus can be placed in a non-planar arrangement when it is manufactured or set in its position for use.

The inventive idea comprises also a corresponding manufacturing method for screen or illumination apparatus. The manufacturing method comprises the steps of:
- manufacturing at least one LED layer (41a-d, 51a-e, 61a-d, 81, 84, 85, 86a-b, 87a-b), each LED layer comprising a plurality of LEDs (43a-d, 52, 84L, 85L, 86L, 87L), where at least one LED layer is at least partly made of a polymer,
- where each single LED layer comprises electrically conductive patterns (60ab), where the LEDs are electrically coupled with the electrically conductive patterns,
- creating a layer arrangement for a single module (11, 20) by stacking the at least one LED layer and possible other layers in a desired order, and repeating the creating step in case of a plurality of modules are desired; and in case at least two modules (11, 20) are formed,
- connecting the at least two modules (11, 20) together in order to form the apparatus.

The manufacturing method can be implemented partly or fully by a computer program which is executable on a processor or other computing means. The computer program comprises code and it may be stored in a computer-readable medium.

In one embodiment, it is possible to place at least one other layer within the LED layer arrangement; i.e. a non-LED layer may be placed between two LED layers. Therefore, the LED layer arrangement can be a distributed group of layers within the whole layer structure. As a summary, the order of LED and non-LED layers may be freely selected among the layer arrangement.

The advantages of the invention are various. The structure is a modular one where the module size is freely scalable. The number of layers and the LED density within a module can be freely selected based on the used application. As a practical advantage relating to the movability and size of the apparatus, the layered screen and illumination apparatus is rollable into a rolled form for easier transport and storage purposes. Also the installment of the device to the desired location is easy from the rolled screen elements. Furthermore, the roll-to-roll method enables a cost-effective manufacturing process if desired.

Furthermore, the structure can be installed in various non-planar shapes because the material is flexible. The sizes of the display or illumination device is highly scalable for different purposes, allowing very large screens for public use and very small screens e.g. in a wristwatch type of a device. Because the base material is polymer, the screen and illumination structure is thin and light-weighted compared to traditional screen structures. Furthermore, polymer can be selected as transparent, and by adding holes to the structure, the transparency can be enhanced even more.

The layered structure with thin layers enables the heat to be managed more easily, in order to direct the emerging heat out of the structure.

Different embodiments disclosed in the dependent claims and in the details above may be combined with one another in order to achieve a new embodiment of the invention.

The present invention is not limited to the above presented embodiments but it may vary within the scope of the claims.

The invention claimed is:

1. A screen apparatus, comprising:
   at least two modules, where each module comprises a layer arrangement of at least two layers, where the at least two layers are at least partly made of a polymer,
   wherein the layer arrangement comprises an LED layer arrangement of at least one LED layer which comprises a plurality of LEDs, where each single LED layer comprises electrically conductive patterns, where the LEDs are electrically coupled with the electrically conductive patterns, and
   wherein the layers are stacked on top of each other for each module in order to form the layer arrangement for the at least two modules, and
   connecting the at least two modules together in order to form the apparatus,
   wherein the layer arrangement is at least partly flexible, and
   the apparatus further comprises a plurality of through-holes across the screen apparatus in order to enhance transparency for the apparatus, and/or for providing spaces for LEDs of an adjacent layer, and/or for providing a route for air and/or water through the screen apparatus.

2. The screen apparatus according to claim 1 wherein the layer arrangement is at least partly transparent.

3. The screen apparatus according to claim 1, wherein the apparatus, when the apparatus is set in a planar form,
   a first part of the LEDs is directed to a first viewing direction and a second part of the LEDs is directed to a second viewing direction opposite to the first direction, resulting in a dual-sided display device.

4. The screen apparatus according to claim 1, wherein the functionality of a single layer is selected from a group of an LED layer, a solar panel layer, an electrically conductive pattern layer, a battery layer, a holed film layer, a physical support layer, a protective layer, a thermally conductive layer, a thermally insulating layer, a diffuser layer, a reflective layer, an electroluminescent emission layer, or a sensor layer comprising at least one dedicated sensor.

5. The screen apparatus according to claim 1, wherein the apparatus further comprises:
   a plurality of modules placed adjacently side by side with a butt joint, or fixed together by a connector.

6. The screen apparatus according to claim 1, wherein a protective layer further comprises:
   protective polymer strips of film placed adjacently to one another, or a layer of film, on at least a part of the surface area of the apparatus, or
   a single protective strip provided on top of the seam between two adjacent modules of the apparatus, or
   a sprayed material on at least a part of the surface area of the apparatus, or
   a polymer material which has been injection molded on at least a part of the surface area of the apparatus.

7. The screen apparatus according to claim 1, wherein the apparatus further comprises:
   a frame structure where the at least one module is fixed to, and wherein the frame structure comprises electrically conductive wires which are connectable to the selected locations of the at least one module through connectors.

8. The screen apparatus according to claim 1, wherein selected layers of a single module, and/or selected layers of adjacent modules are fixed and/or electrically coupled by connectors, where the connectors are made of an electrically conductive material.

9. The screen apparatus according to claim 1, wherein the electrically conductive pattern of a selected layer is electrically coupled to a connector by a connection securing configuration when the connector is in place, and where the connector is conductive, and where the connection securing configuration is an additional section of an electrically conductive wire pressing onto the connector, and/or a conductive adhesive placed around the connector.

10. The screen apparatus according to claim 1, wherein the apparatus comprises:
    one or two LED layer arrangements,
    one or two solar panel layers, and
    at least one battery layer,
    arranged in an order, where the solar panel layer or layers are able to collect light energy either directly as an outermost layer or through the at least partly transparent layers of the screen apparatus, resulting into a one- or dual-sided screen apparatus.

11. The screen apparatus according to claim 10, wherein the LED layer arrangement is combined with another LED layer arrangement, where the latter LED layer arrangement has been flipped 180 degrees before the combining, in order to achieve a dual-sided LED screen.

12. The screen apparatus according to claim 1, wherein the apparatus further comprises wireless connectivity function.

13. The screen apparatus according to claim 12, wherein the apparatus further comprises IoT connectivity function.

* * * * *